United States Patent [19]

Larson, III

[11] Patent Number: 5,185,573
[45] Date of Patent: Feb. 9, 1993

[54] METHOD FOR FOCUSING OF MAGNETIC RESONANCE IMAGES

[75] Inventor: John D. Larson, III, Palo Alto, Calif.

[73] Assignee: Hewlett-Packard Company, Palo Alto, Calif.

[21] Appl. No.: 685,945

[22] Filed: Apr. 16, 1991

[51] Int. Cl.$^5$ ............................................ G01R 33/20
[52] U.S. Cl. ..................................... 324/309; 324/307
[58] Field of Search ............... 324/300, 307, 309, 318, 324/322; 128/653 A, 653 SC

[56] References Cited

U.S. PATENT DOCUMENTS

| | | |
|---|---|---|
| 3,789,832 | 2/1974 | Damadian . |
| 4,015,196 | 3/1977 | Moore et al. . |
| 4,021,726 | 5/1977 | Garroway et al. . |
| 4,070,611 | 1/1978 | Ernst . |
| 4,115,730 | 9/1978 | Mansfield . |
| 4,297,637 | 10/1981 | Crooks et al. . |
| 4,318,043 | 3/1982 | Crooks et al. . |
| 4,318,044 | 3/1982 | Mansfield . |
| 4,390,840 | 6/1983 | Ganssen et al. ..................... 324/309 |
| 4,467,282 | 8/1984 | Siebold ................................. 324/309 |
| 4,626,784 | 12/1986 | Sepponen ............................. 324/309 |
| 4,825,161 | 4/1989 | Barnea et al. ........................ 324/309 |
| 4,849,886 | 7/1989 | Takase ................................. 324/309 |
| 4,859,945 | 8/1989 | Stokar ................................. 324/309 |
| 4,876,507 | 10/1989 | Van Vaals ........................... 324/307 |
| 4,896,113 | 1/1990 | Pelc .................................... 324/309 |
| 4,973,111 | 11/1990 | Haacke et al. ...................... 324/309 |
| 5,113,137 | 5/1992 | Koizumi et al. .................... 324/307 |

OTHER PUBLICATIONS

F. Bloch, "Nuclear Induction", Phys. Rev., vol. 70 (1946) 460–474.
F. Bloch, "The Nuclear Induction Experiment", Phys. Rev., vol. 70 (1946) 474–485.
A. Abragam, *The Principles of Nuclear Magnetism*, Clarendon Press, Oxford University, 1961, 39–75.
R. Damadian, "Tumor Detection by Nuclear Magnetic Resonance", Science, vol. 171 (1971) 1151–1153.
I. D. Weisman et al., "Recognition of Cancer in vivo by Nuclear Magnetic Resonance", Science, vol. 178 (1972) 1288–1290.
P. C. Lauterbur, "Image Formation by Induced Local Interactions: Examples Employing Nuclear Magnetic Resonance", Nature, vol. 242 (1973) 190–191.
J. C. Eggleston et al., "Nuclear Magnetic Resonance Studies of Several Experimental and Human Malignant Tumors", Cancer Research, vol. 33 (1973) 2156–2160.
R. Damadian et al., "Human Tumors Detected by Nuclear Magnetic Resonance", Proc. Nat. Acad. Sci., vol. 71 (1974) 1471–1473.
R. Damadian et al., "Field Focusing Nuclear Magnetic Resonance (FONAR): Visualization of a Tumor in a Live Animal", Science, vol. 194 (1976) 1430–1432.
P. Mansfield et al., "Biological and Medical Imaging by NMR", Jour. of Mag. Resonance, vol. 29 (1978) 355–373.
E. C. Burdette et al., "In-Situ Tissue Permittivity at Microwave Frequencies: Perspectives, Techniques, Results", in *Medical Applications of Microwave Imaging*, ed. by L. E. Larsen, I.E.E.E. Press, New York, 1986, 13–40.
S. J. Foti, "A Water-Immersed Microwave Phased Array System for Interrogation of Biological Targets", in *Medical Applications of Microwave Imaging* ed. by L. E. Larsen, I.E.E.E. Press, New York, 1986, 148–166.
A. Haase et al., "Flash Imaging: Rapid NMR Imaging Using Low Flip-Angle Pulses", Jour. of Mag. Resonance, vol. 67 (1986) 258–266.
L. Axel et al., "Linogram Reconstruction for Magnetic Resonance Imaging (MRI)", I.E.E.E. Transactions on Medical Imaging, vol. 9 (1990) 447–449.

*Primary Examiner*—Michael J. Tokar

[57] ABSTRACT

Apparati and methods for magnetic resonance imaging a selected interrogation volume in a tissue of a human or animal body, to provide increased signal-to-noise ratios for fixed data acquisition times. The method involves excitation of magnetic resonance in a selected interrogation volume that may be as small as 500–3,000 cm$^3$, through controllable focusing or steering of a rotating magnetic field signal used to induce magnetic resonance. The response signals issued by the excited volume element are then collected by focusing of these response signals, using a phased array of antennae for this purpose. Use of the invention with well known nuclear magnetic resonance excitation procedures, such as spin echo, echo planar, gradient recalled and back-projection, are discussed.

19 Claims, 19 Drawing Sheets

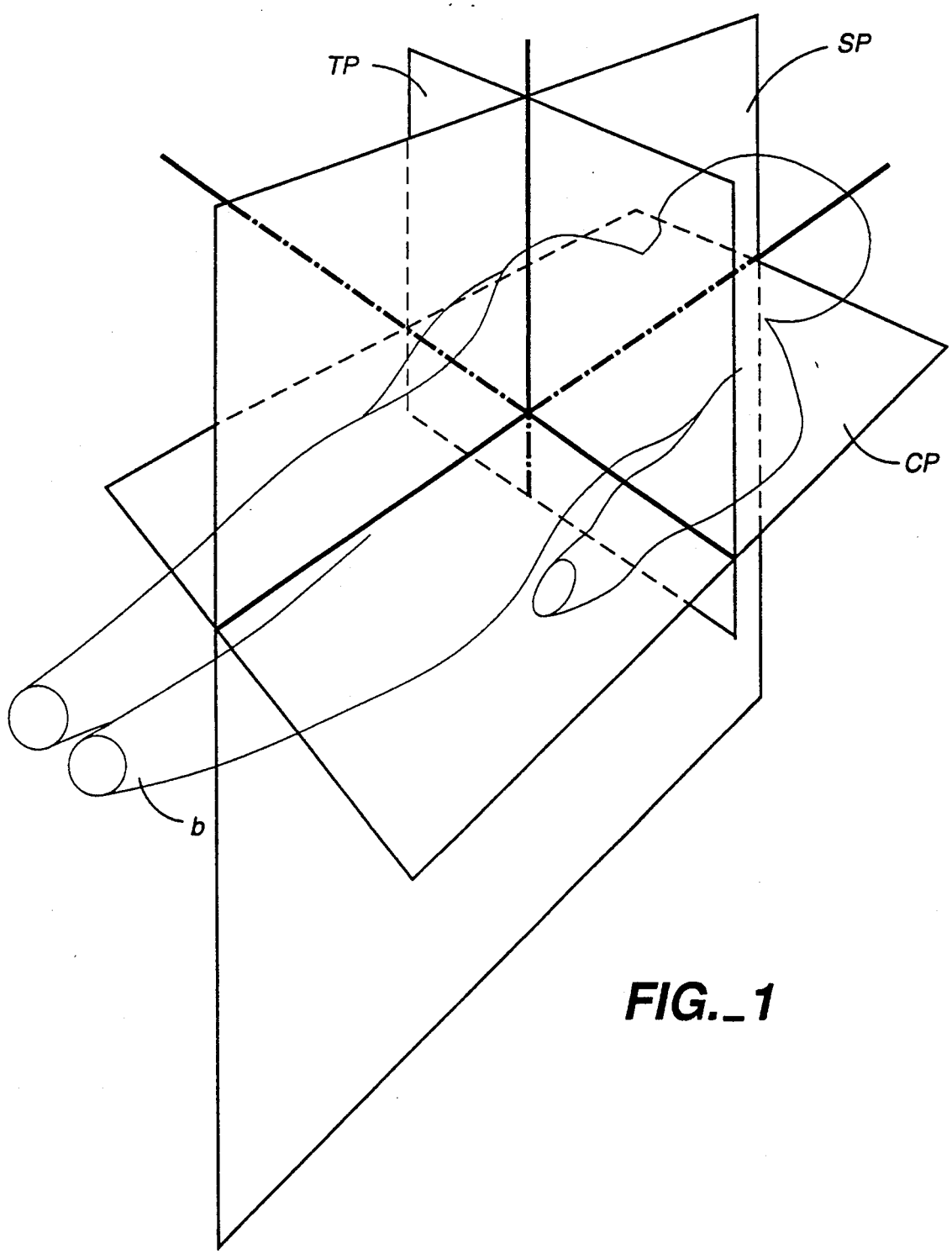
FIG._1

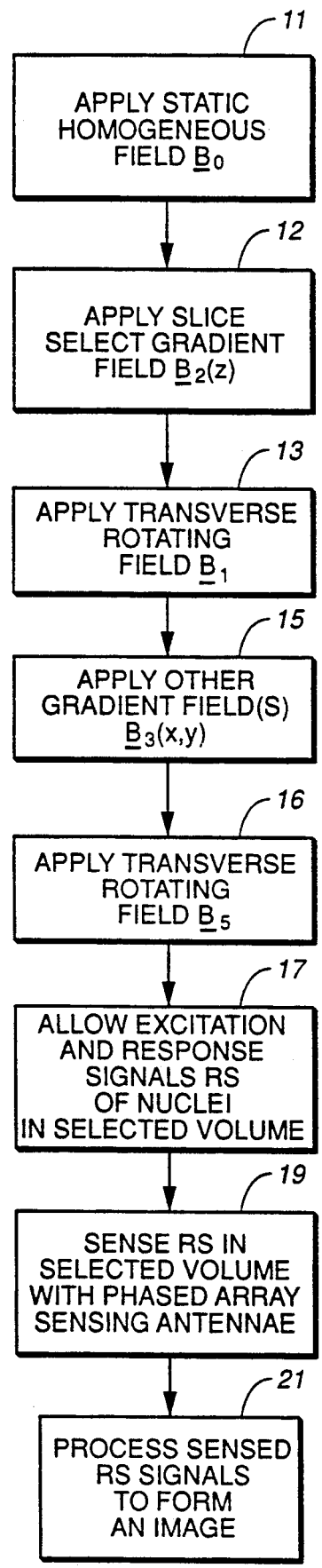
FIG._2

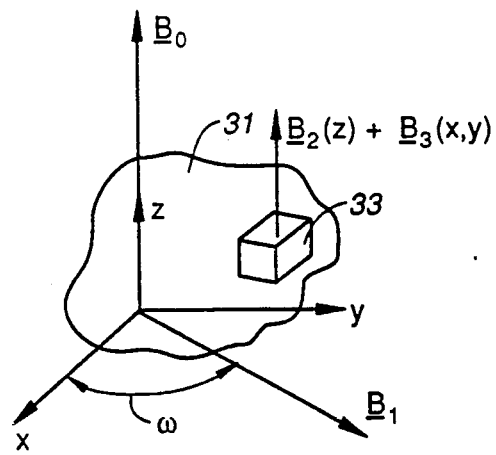
FIG._3
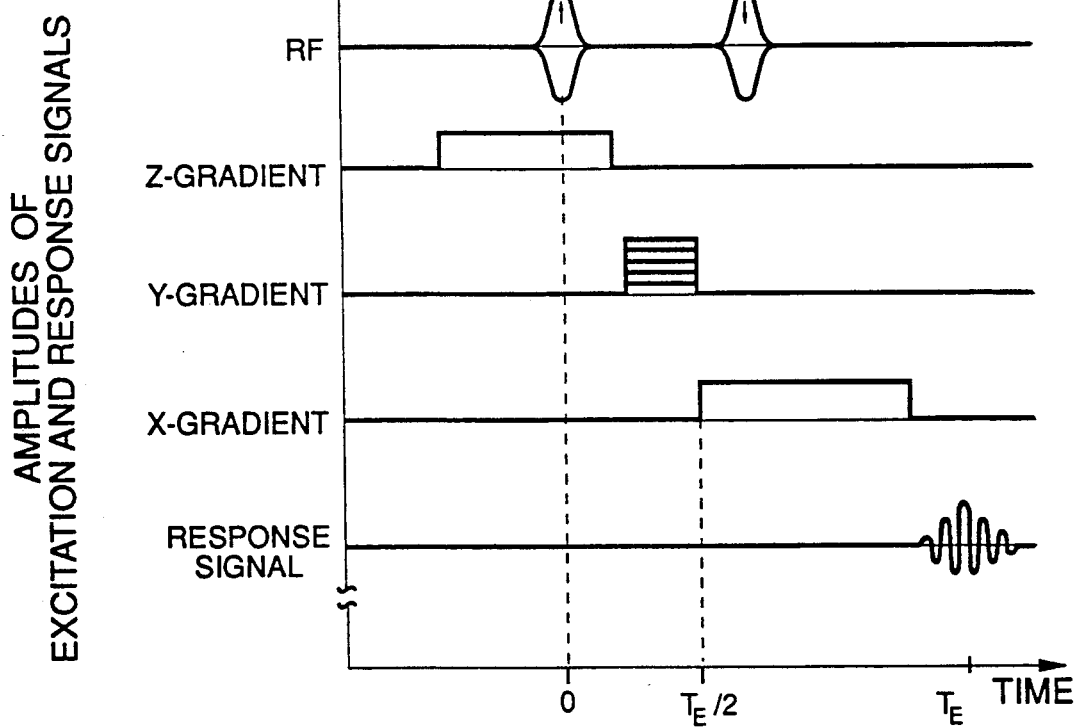
FIG._6B

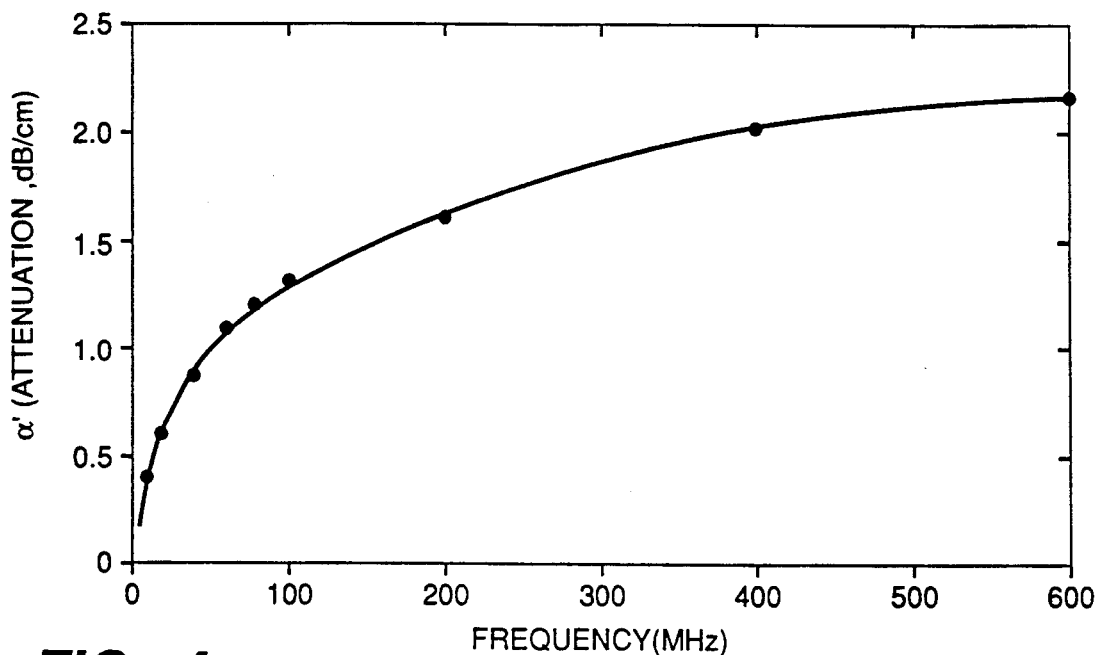
FIG._4
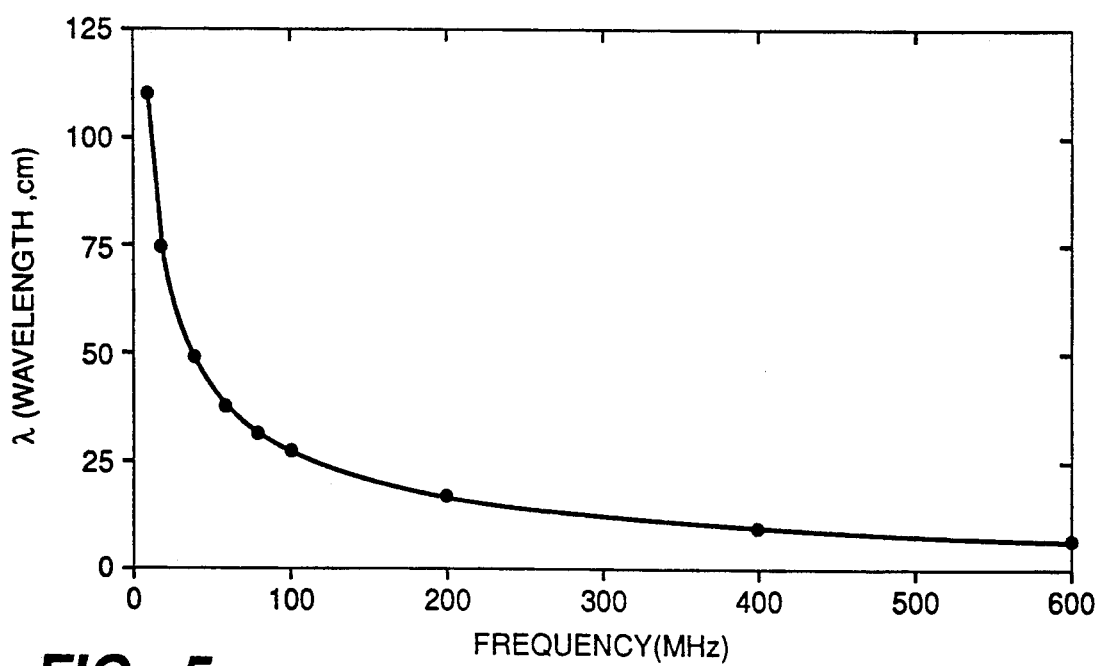
FIG._5

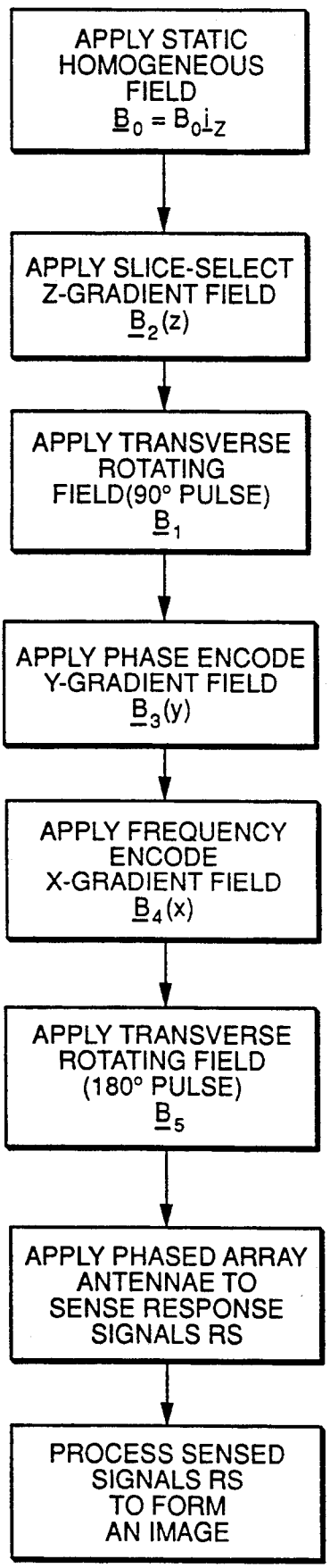
FIG._6A

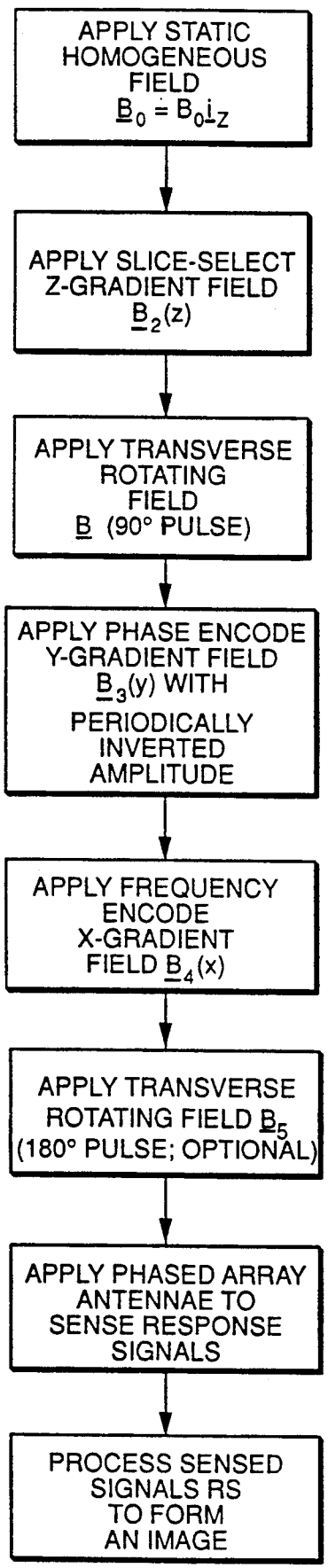
FIG._7A

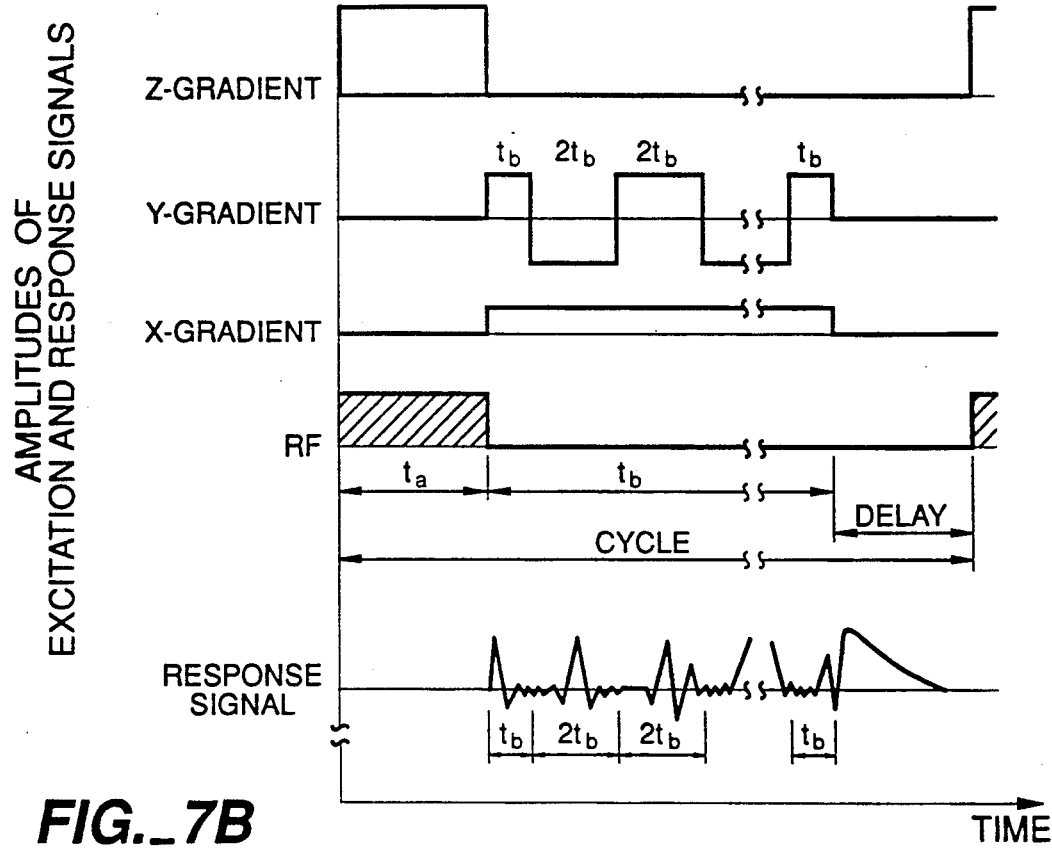
FIG._7B
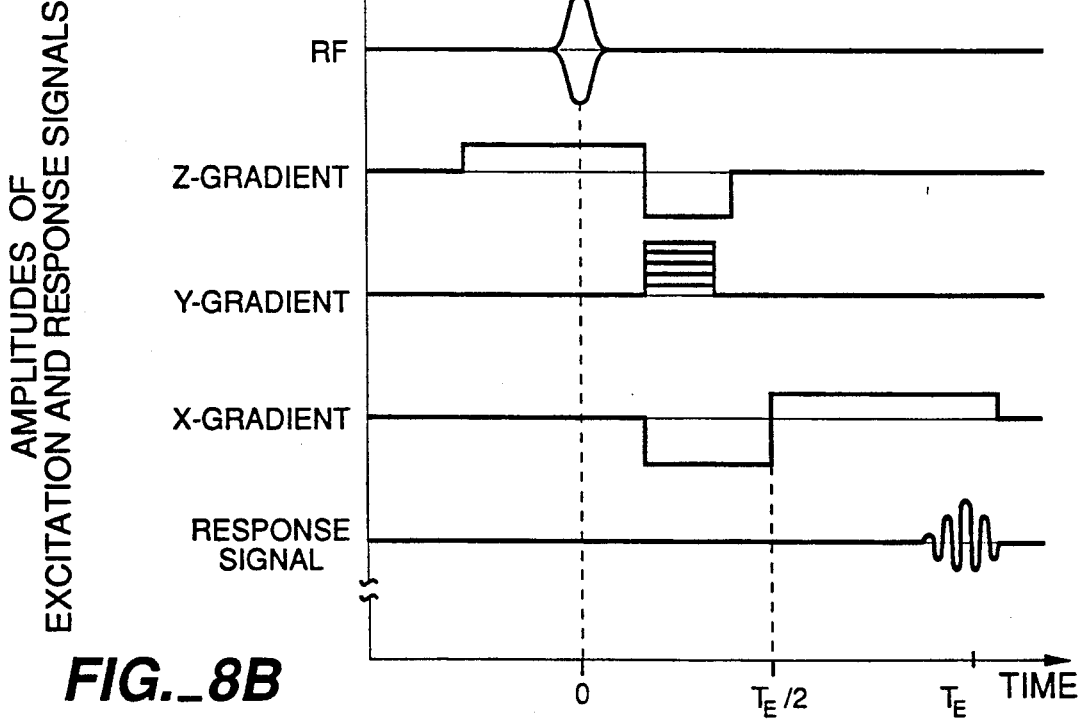
FIG._8B

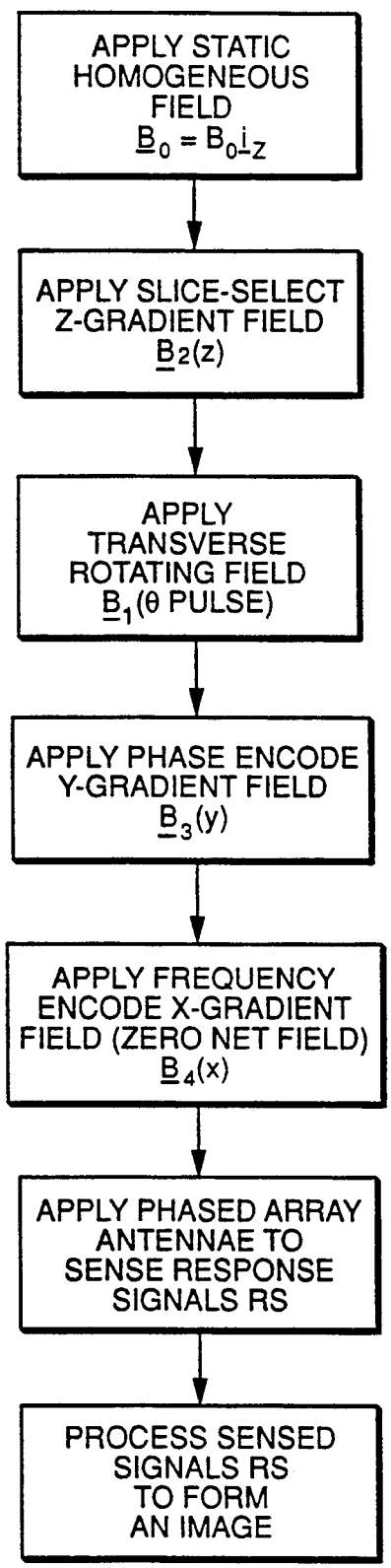
FIG._8A

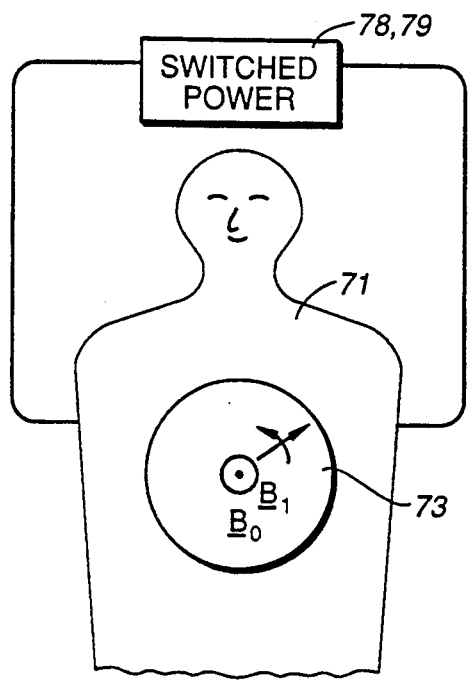
FIG._9A
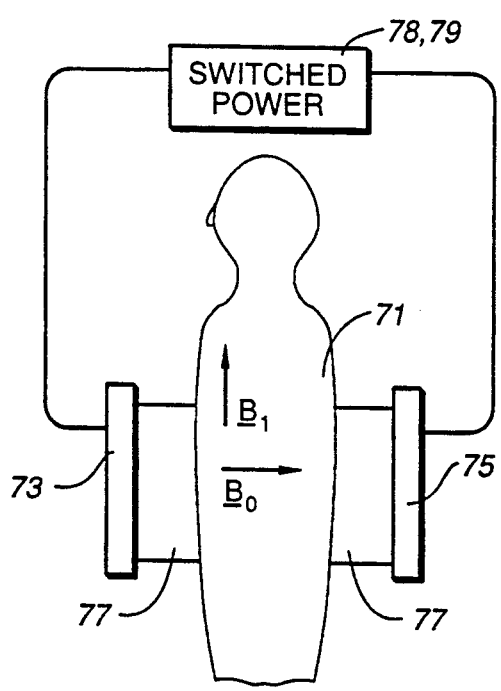
FIG._9B

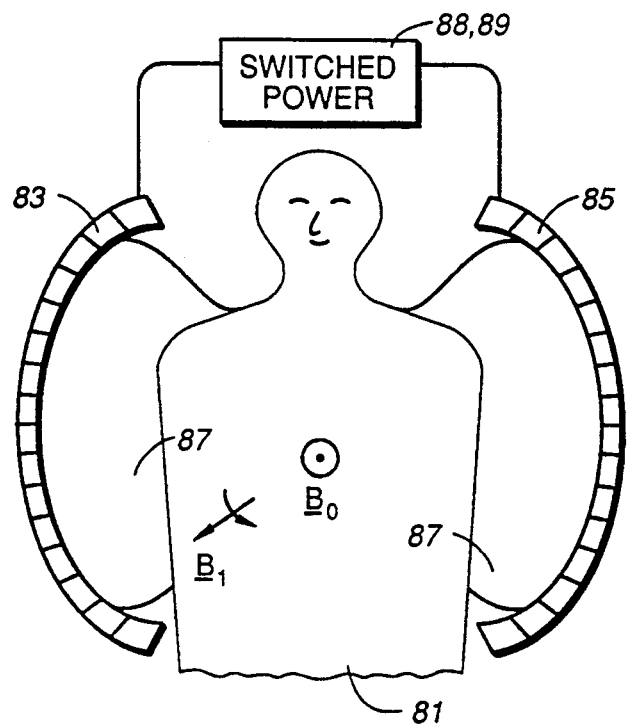
FIG._10A
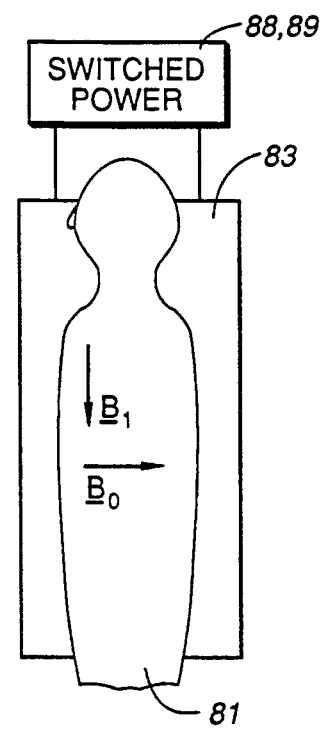
FIG._10B

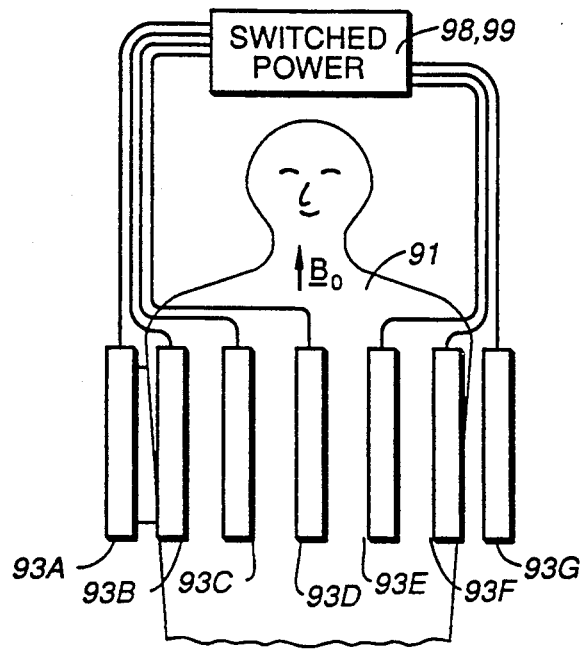
FIG._11A
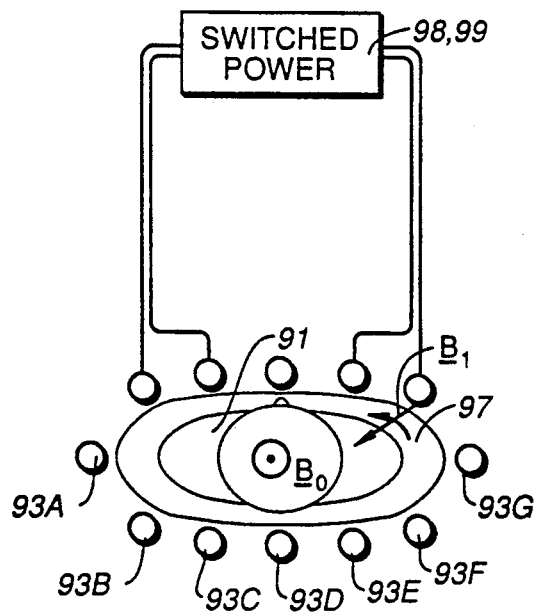
FIG._11B

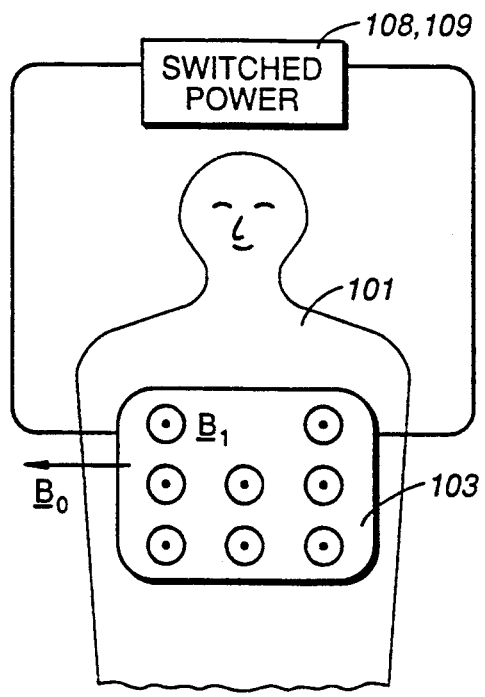
FIG._12A
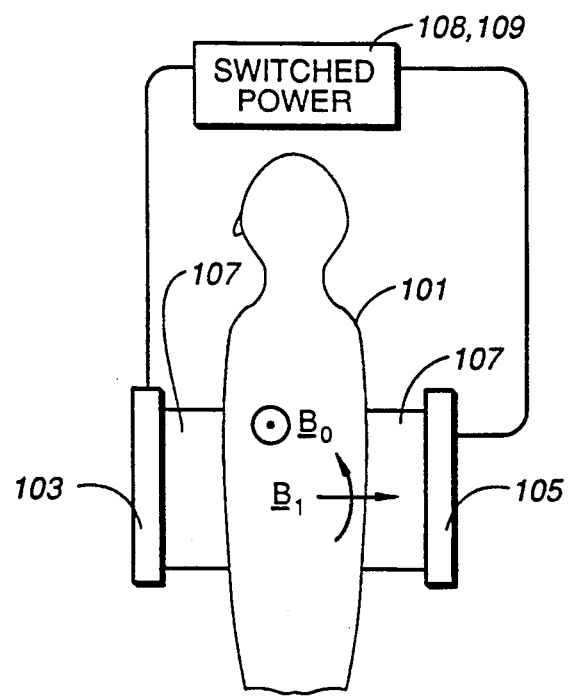
FIG._12B

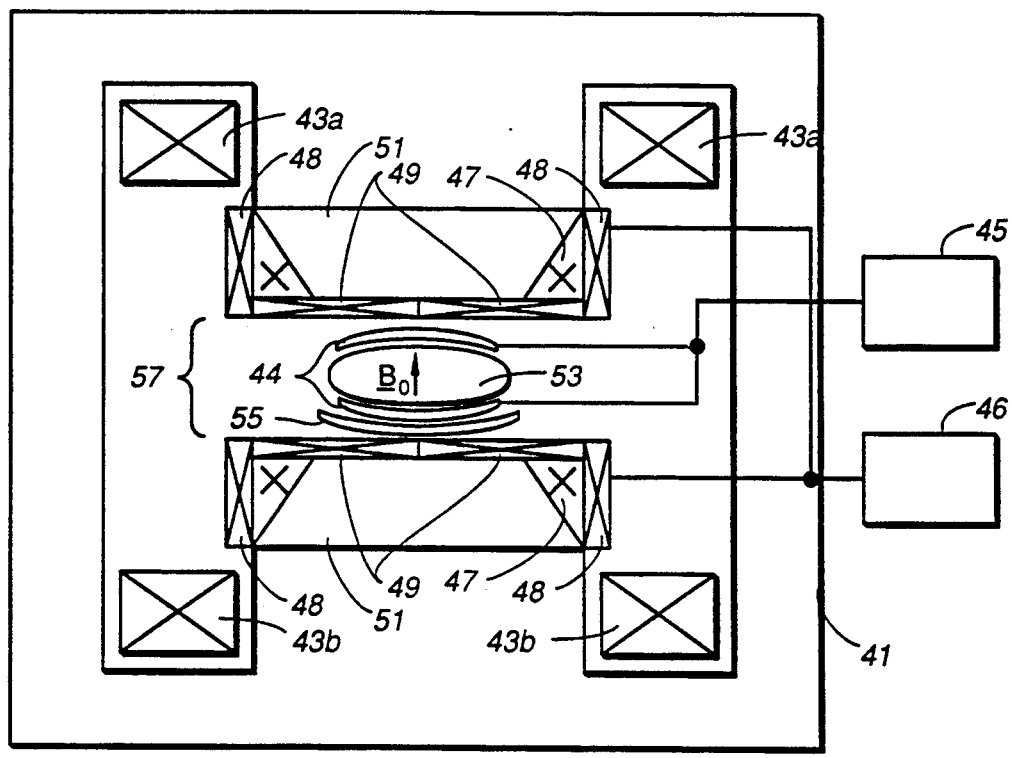
FIG._13
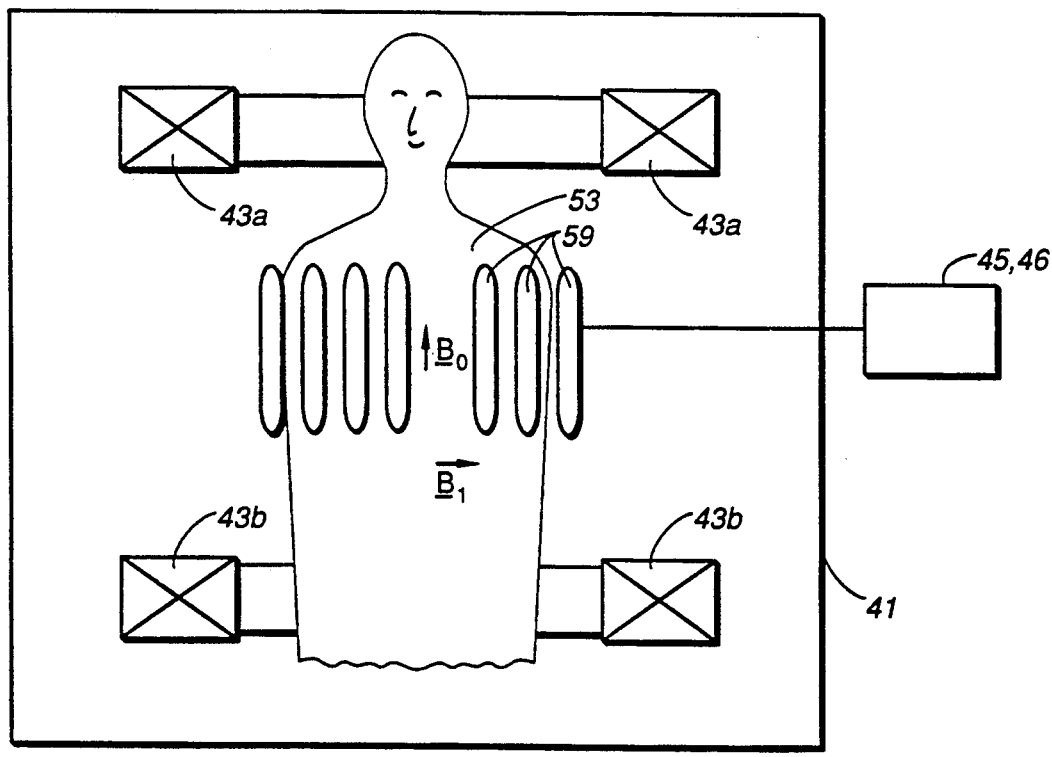
FIG._15

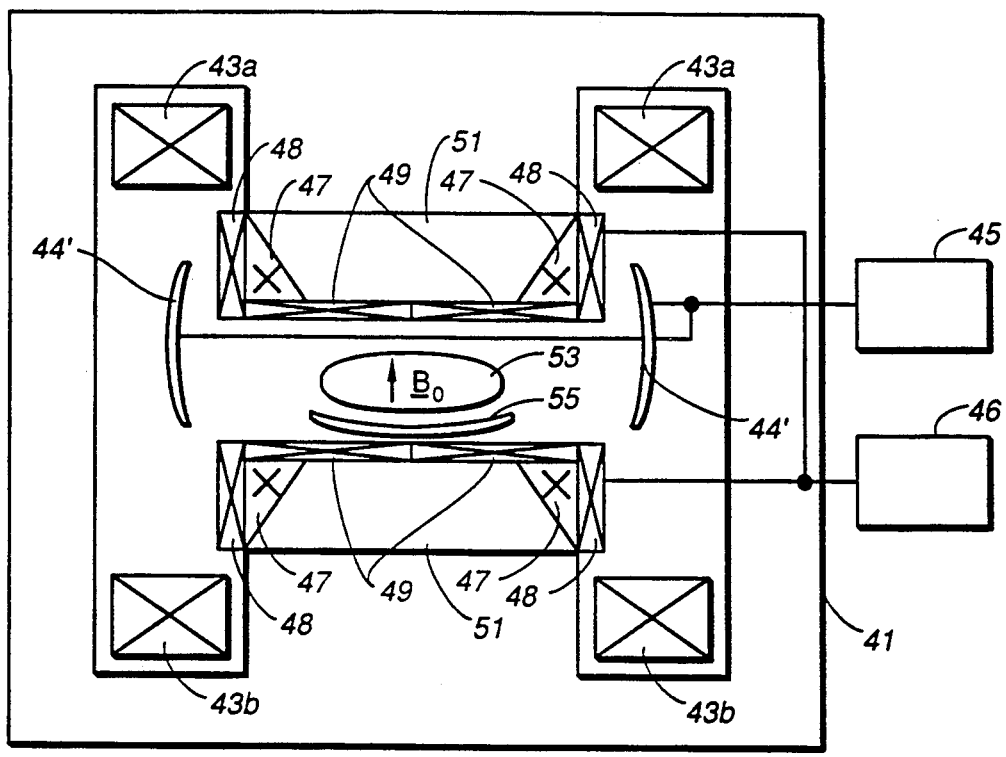
FIG._14A
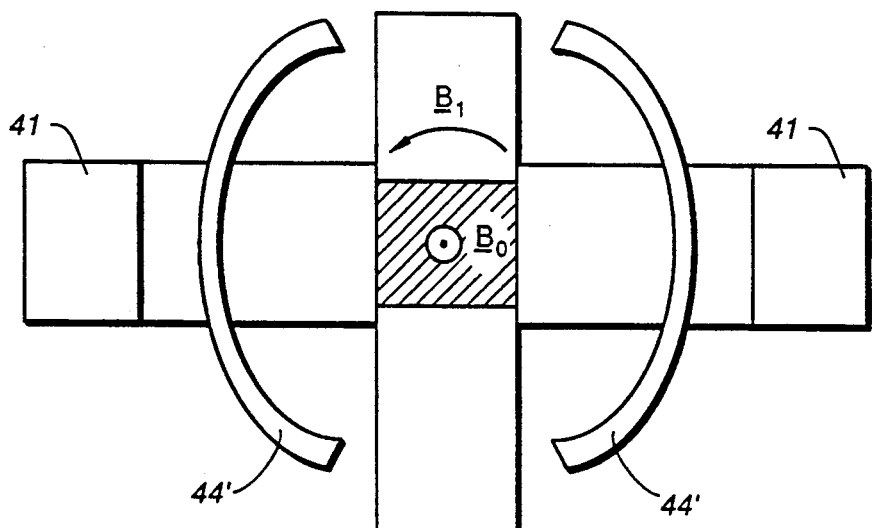
FIG._14B

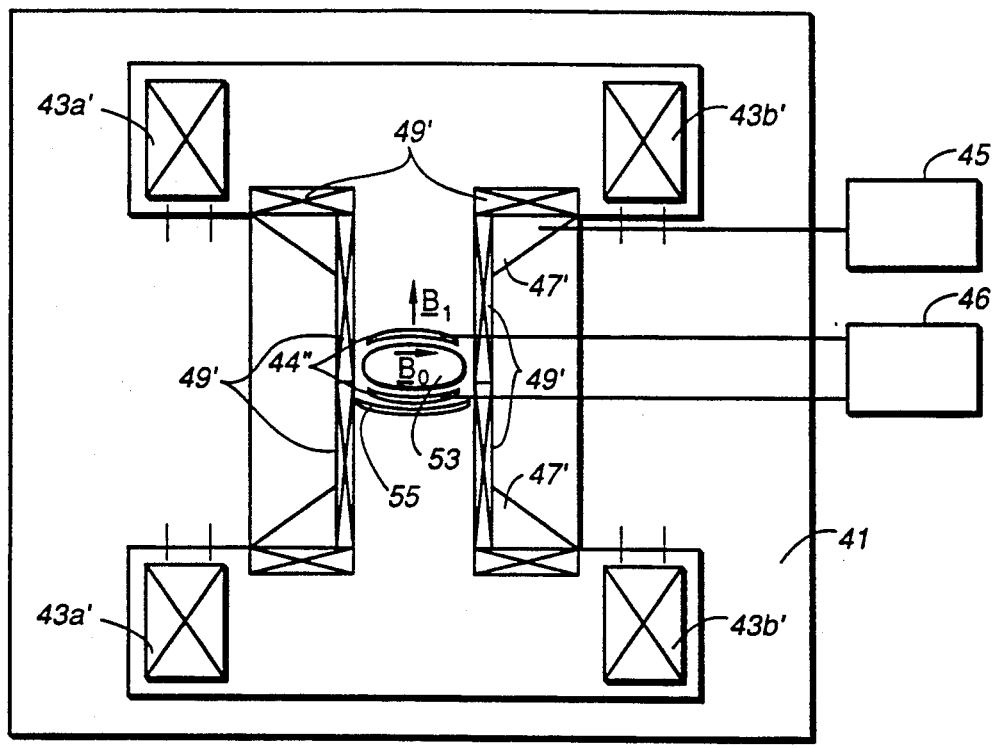
FIG._16
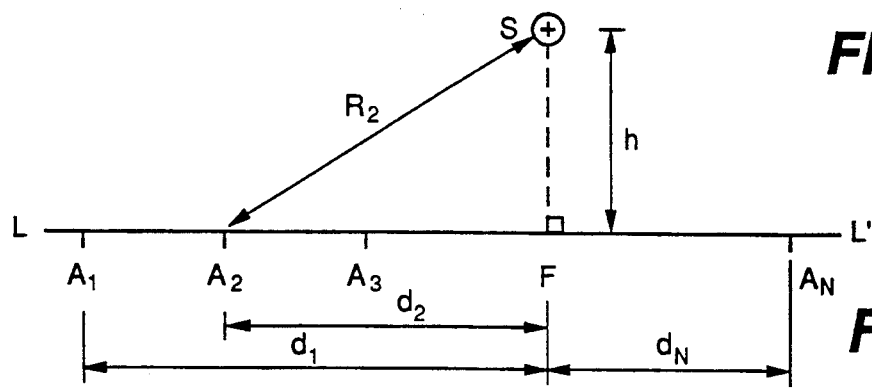
FIG._17
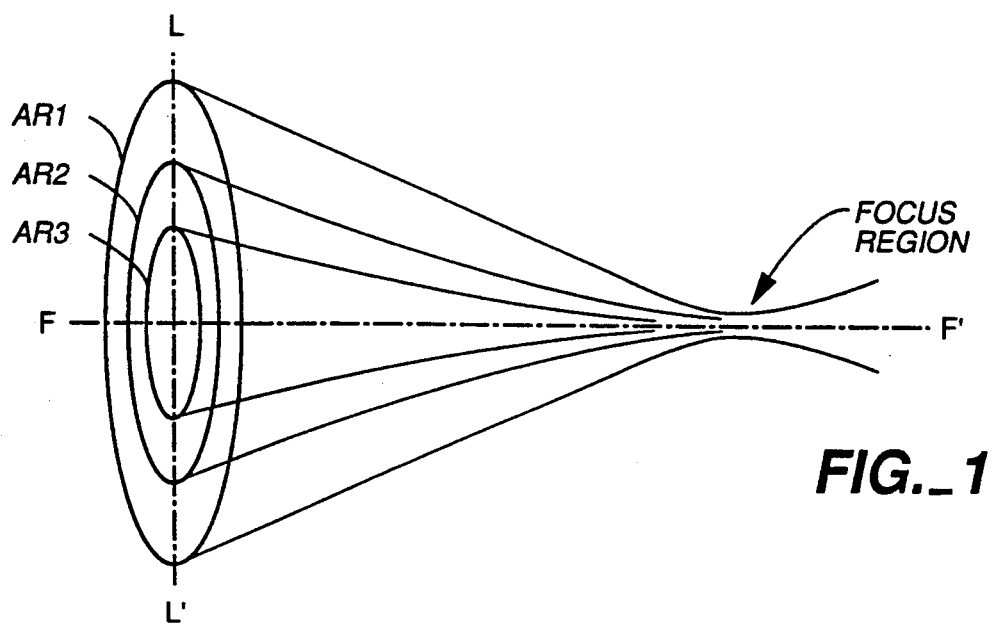
FIG._18

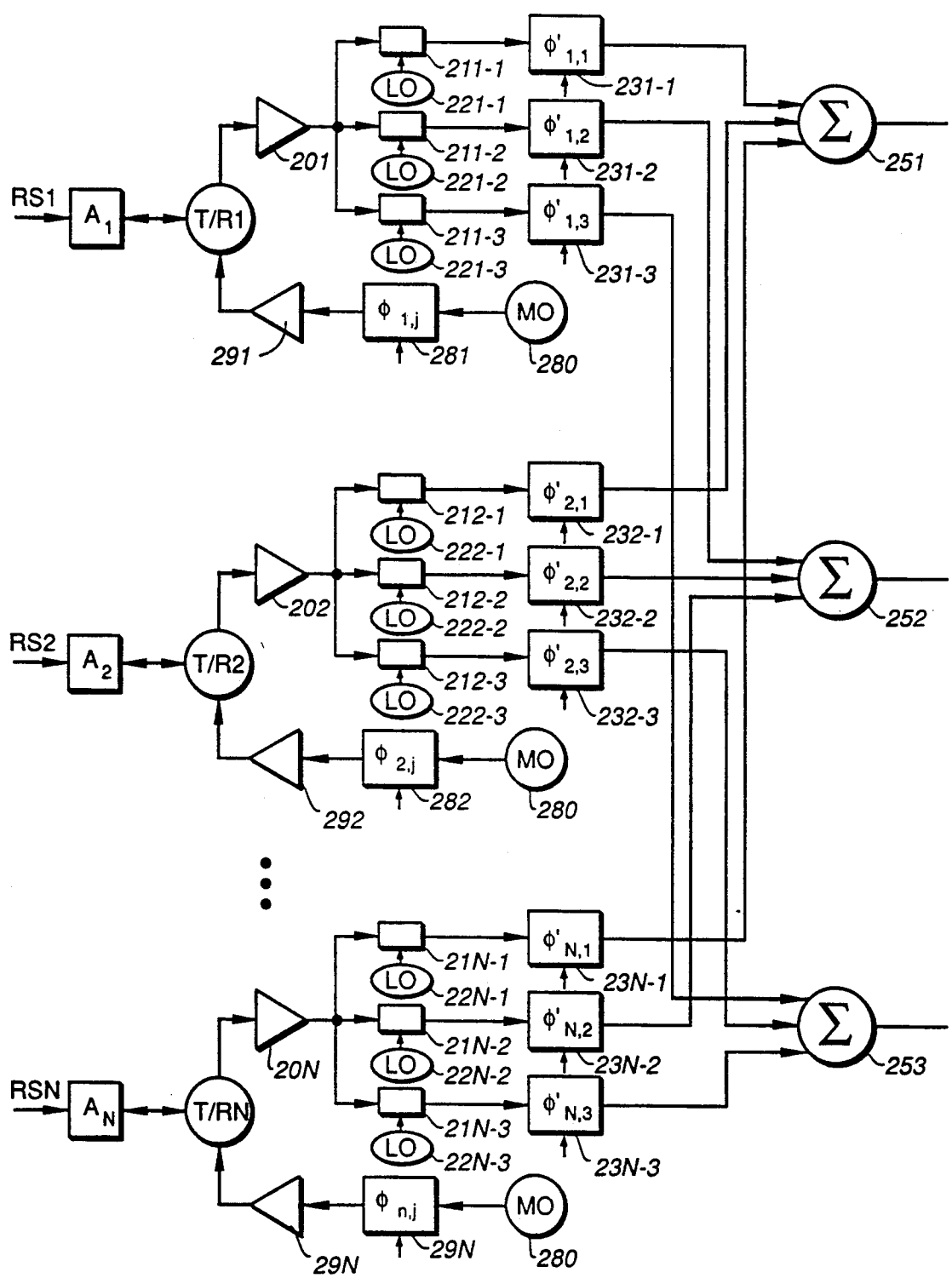
FIG._19A

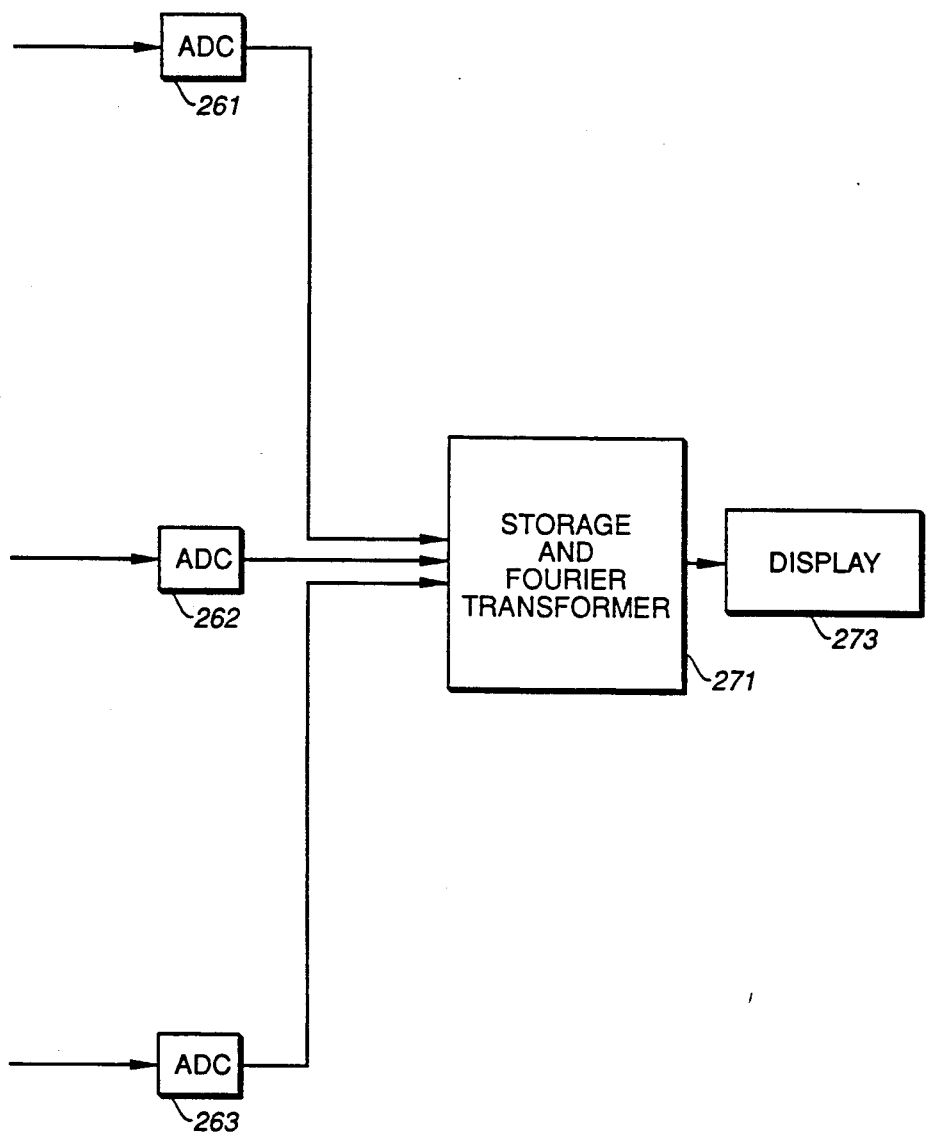
FIG._19B
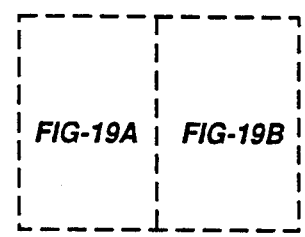
FIG._19

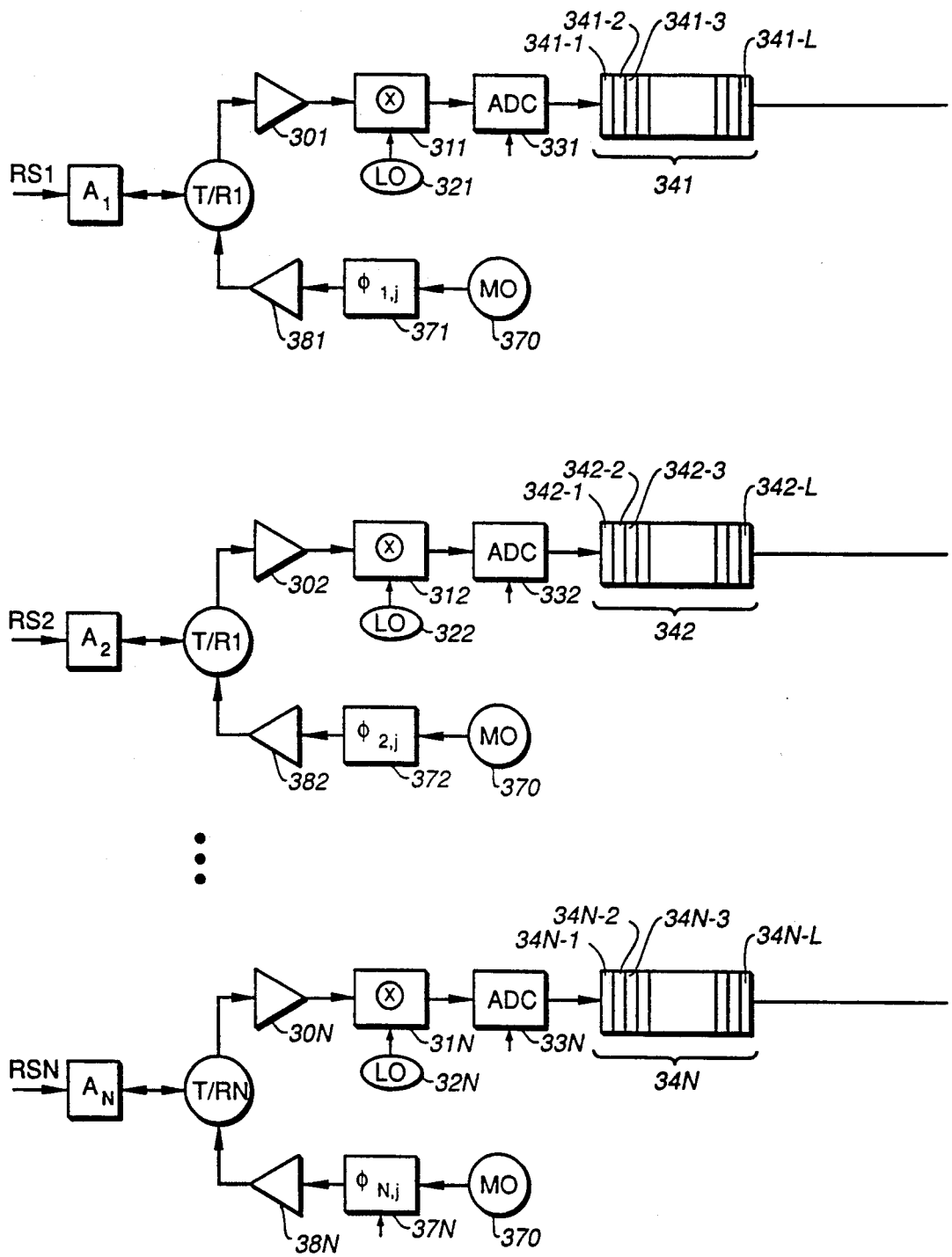
FIG._20A

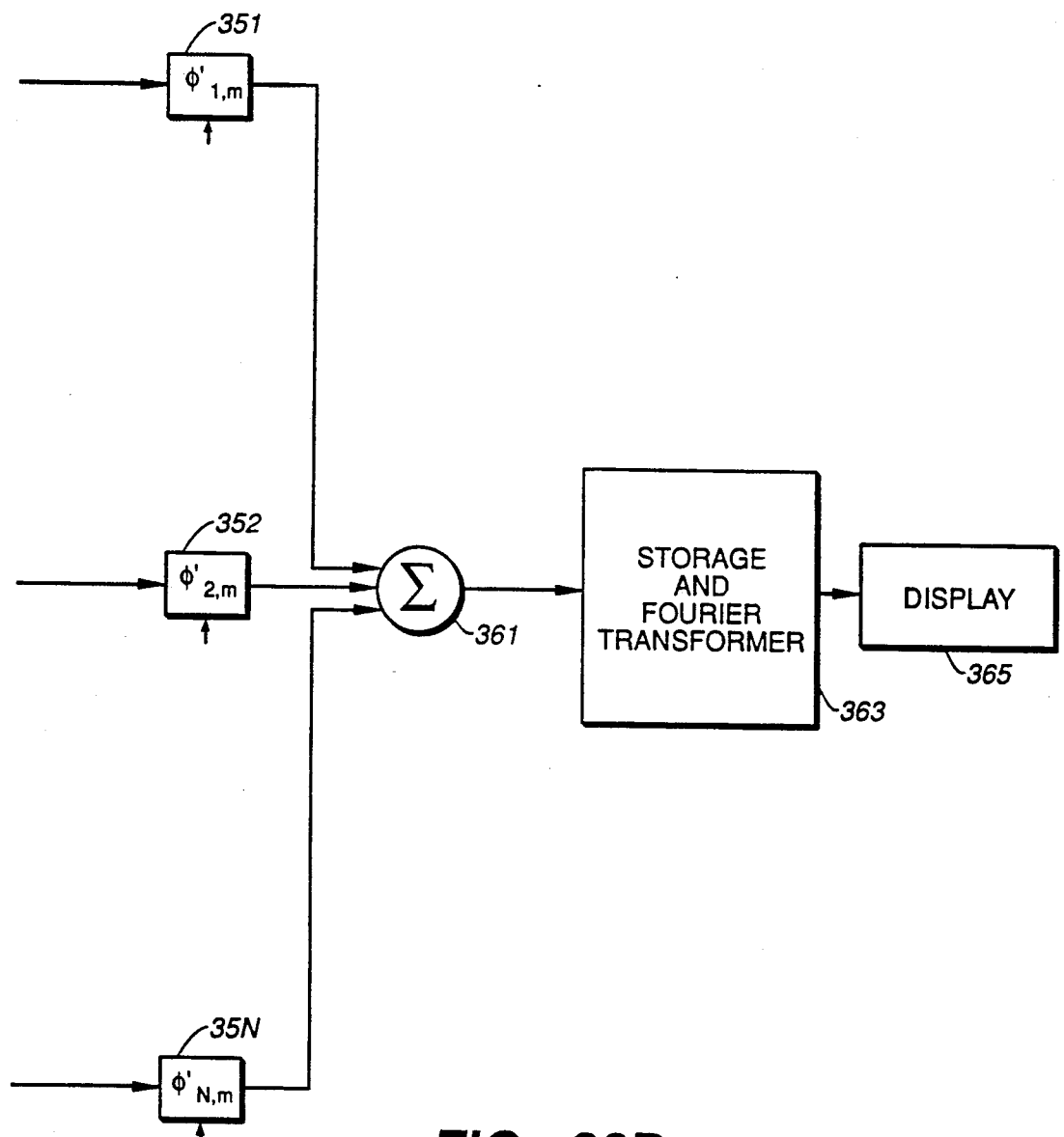
FIG._20B
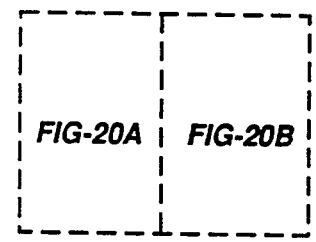
FIG._20

METHOD FOR FOCUSING OF MAGNETIC RESONANCE IMAGES

FIELD OF THE INVENTION

This invention relates to medical imaging of a human or animal body, and particularly of the cardiac region, using RF focusing techniques together with nuclear magnetic resonance imaging in high magnetic fields, to improve the signal-to-noise ratio per unit data acquisition time and to improve the spatial resolution, spectroscopic sensitivity and/or data throughput rate of such imaging.

BACKGROUND OF THE INVENTION

Medical imaging techniques for organs and tissues in a human or animal body have changed considerably over the last 20 years, in good measure because of adoption of nuclear magnetic resonance imaging for medical imaging. Damadian(Science 171(1971) 1151–1153), Weisman(Science 178 (1972) 1288–1290), Lauterbur(Nature 242(1973) 190–191), Eggleston et al(Cancer Research 33 (1973) 2156–2160) and Damadian et al (Proc. Nat. Acad. Sci. 71 (1974) 1471–1473; Science 194 (1976) 1430–1431) were among the first to recognize the value of, and to apply the techniques of, NMR to distinguish between normal and abnormal developments in human and animal bodies.

Nuclear magnetic resonance ("NMR") is a relatively young research area and was first discussed and experimentally investigated by Bloch and his co-workers in 1946 (Phys. Rev. 70 (1946) 460–474 and 474–485). The Bloch articles are incorporated herein by reference. In NMR, an approximately constant magnetic field $B_0 = B_{0}i_z$ is applied in a fixed direction, which defines the z-axis of the associated coordinate system, to the target(organ, tissue, etc.), and a time-varying field $B_1 = B_1(i_x \cos \omega t + i_y \sin \omega t)$ is applied in a plane perpendicular to the z-direction, where the amplitude $B_1$ is also approximately constant. The magnetic polarization vector $\underline{M}$ satisfies the magnetization torque equation $$d\underline{M}/dt = \gamma(\underline{M} \times \underline{B}) + (M_0/T1)\underline{i}_z - \underline{\Omega} \cdot \underline{M} \qquad (1)$$

where $\gamma$ is the gyromagnetic ratio, $\underline{B} = \underline{B}_0 + \underline{B}_1$ is the total impressed magnetic field, $M_0$ is an equilibrium magnetization established by the polarization field, T1 is a characteristic time interval for return to equilibrium of the transverse component of magnetization, T2 is a characteristic time interval describing de-phasing of the magnetization, and $\underline{\Omega}$ is a diagonal second rank tensor or dyadic that phenomenologically accounts for relaxation of the three magnetization components that is of the form $$\underline{\Omega} = \begin{bmatrix} 1/T2 & 0 & 0 \\ 0 & 1/T2 & 0 \\ 0 & 0 & 1/T1 \end{bmatrix}. \qquad (2)$$

For protons, the ratio $\epsilon$ is 42.57 MHz per Tesla. The spin-lattice relaxation time T1 and the spin-spin relaxation time T2 are often of the order of 600–1,000 msec and 20–100 msec, respectively. The observable quantities are $M_x$ and $M_y$.

These equations can be solved under various driving and receiving field conditions to obtain the magnetization components for the system. When the system is excited by a radiofrequency ("RF") magnetic field intensity $\underline{B}_1$ at or near the resonant frequency $f_0 = \omega_0/2\pi = \gamma B_0$, the spin system will draw energy from the RF exciting field. Conversely, if the spin system is near resonance, energy can be returned to a structure positioned to receive this RF energy. Analysis of the system of equations is Eq. (1) is discussed by A. Abragam, *The Principles of Nuclear Magnetism*, Oxford University Clarendon Press, 1961, pp. 37–75, and is incorporated herein by reference. Medical imaging is concerned generally with receipt and interpretation of the fields produced by this given-back energy.

In subsequent discussions, it will be assumed that the frame of reference is one that rotates with the RF rotating magnetic field $\underline{B}_1$ at the resonant frequency $f_0$. The magnetization components $M_{x'}$ and $M_{y'}$ are of particular interest here. In a frame rotating with the field, the magnetic field directed along the x'-axis in the rotating frame produces a magnetization only along the y'-axis. In this frame, the broadband RF pulse and various gradient magnetic fields (discussed below) that perturb the spin system are easily visualized and analyzed.

One problem that faces any approach to excitation, selective or otherwise, of a tissue, organ or other biological component of a human or animal body (herein referred to simply as "tissue" for convenience), or parts thereof, is that the "noise", which arises from tissue not within the desired volume element, is often substantial because of the relatively large surrounding tissue volume that produces such noise. A time-varying magnetic field $\underline{B}_1$ in the tissue produces a corresponding electric field $\underline{E}_1$ by Maxwell's equations, and because the tissue has non-zero conductivity, this produces a corresponding non-zero current vector $\underline{J}$. The volume integral of the scalar product of $\underline{J}$ and $\underline{E}$ gives rise to power dissipation in the entire tissue volume element, and this produces noise at the signal sensing apparatus unless the field of view of the tissue volume element can be somehow limited. This process can be represented by a "body noise" resistor whose contribution is proportional to tissue conductivity. Noise sets a lower limit on the resolution, expressed as the smallest volume of tissue that can be sensed by the receiver, and sets a lower limit on the length of the time interval over which signal acquisition is possible. Noise is produced by uncontrolled electronic action in the receiver circuits ("Johnson noise"), by the "body noise" resistor noise source, and by thermally induced magnetization in the tissue being imaged.

Three volume elements, of quite different sizes, are involved here: (1) tissue volume, which can be a few hundred to a few hundred thousand cm³ in size; (2) RF signal interrogation volume from which the receiver receives the sensed response signals; and (3) magnetic resonance excitation volume or "voxel volume" within the tissue, which can be much less than 1 mm³ in size. The interrogation volume is defined by the volume surrounded by the coil, applicator or other transmitter used to generate the RF magnetic field and by the extend of the unwanted electric field generated in the body itself. In conventional approaches, this interrogation volume can be 50,000–100,000 cm³, which is much larger than the tissue volume for cardiac monitoring. Preferably, the interrogation volume should be about the same size as the tissue volume, or smaller.

According to one well known relation in magnetic resonance physics, the signal-to-noise ratio (SNR) is proportional to the product of $\underline{B}_0$ and a volume ratio:

$$SNR \propto B_0[\text{voxel volume/interrogation volume}][\Delta t]^{\frac{1}{2}},$$

where $\Delta t$ is the data acquisition time and $B_0$ is the primary magnetic field strength. Increase of $B_0$ causes a proportional increase in the system's resonant frequency. Increase of $\Delta t$ is often constrained by throughput requirements. Increase of $\underline{B}_0$ and/or reduction of the interrogation volume is thus a primary concern, if the signal-to-noise ratio is to be increased.

What is needed here is an approach that (1) minimizes or suppresses the body noise per unit acquisition time that issues from the tissue volume, and (2) increases the available signal per unit acquisition time.

SUMMARY OF THE INVENTION

These needs are met by the invention which, in one embodiment, provides a method for limiting the field of view, and thus the noise contribution, by reducing the interrogation volume element to a size no larger than 3,000 cm$^3$ in a tissue in a human or animal body. The method provides for increased signal by use of a primary magnetic field $\underline{B}_0$ of larger magnitude (2–10 Tesla). In order to limit the field of view within the body or tissue, a high frequency RF magnetic field, with $f_0 = 85$–340 MHz, is chosen for the rotating field. The corresponding or effective wavelength $\lambda$ within the tissue is relatively short (11–41 cm), due to the high dielectric permittivity of tissue at such frequencies. This short effective wavelength allows one to focus the RF energy within a modest size interrogation volume element in the tissue, thus markedly limiting the field of view.

According to this method, a first or primary magnetic field (intensity) $\underline{B}_0 = B_0\underline{i}_z$ is applied in a first (z) direction and a second focused magnetic field $\underline{B}_1(x,y,z,t)$, sometimes referred to herein as $\underline{B}_1$ for convenience of notation, is applied in a perpendicular (xy) plane, where $\underline{B}_1$ has constant magnitude, rotates in the xy-plane with approximately constant angular frequency $\omega$, and is applied only over a first time interval $t_1 > t > t_1 + \Delta t_1$ for predetermined quantities $t_1$ and $\Delta t_1$. Application of the field $\underline{B}_1$ provides a "theta pulse" that tips the magnetization vector $\underline{M}$ away from the z-axis toward the xy-plane by a predetermined reorientation angle $\theta$, and two popular choices are $\theta = 90°$ and $\theta = 10°$–20°, as discussed below. For convenience of notation, the primes on the coordinates x, y, z in the rotating frame for dropped in the following discussion.

A slice select gradient magnetic field $\underline{B}_2(z)$ is applied to the tissue, either simultaneously with or preceding application of the field $\underline{B}_1$, to convert a portion of the longitudinal magnetization $M_0$ in a selected z-slice into xy-plane magnetization $M_x$ and/or $M_y$ over a predetermined time interval given by $t_2 < t < t_2 + \Delta t_2$, where $t_2 \leq t_1$.

One or more additional gradient magnetic fields $\underline{B}_3(x,y)$ is then applied to put the magnetization in selected tissue voxel volume elements within the chosen z-slice into differential magnetic resonance over a predetermined time interval, in order to "tag" the (x,y) spatial locations of these voxels. The gradient magnetic fields $\underline{B}_2(z)$ and $\underline{B}_3(x,y)$ all have field vectors parallel to the field vector of the primary magnetic field $\underline{B}_0$. A "read" cycle is then initiated by application of an RF magnetic field $\underline{B}_5(x,y,z,t)$ plus another gradient magnetic field $\underline{B}_6(x,y)$, or of the gradient magnetic field $\underline{B}_6(x,y)$ alone, to the tissue voxel volume elements within the z-slice. The magnetization thus produced excites electromagnetic signals that issue from the selected tissue voxel volume elements within a determinable tim interval given by $t_{sig} < t < t_{sig} + \Delta t_{sig}$. The spatial locations of these voxel volume elements, from which the electromagnetic signals issue, are thus "tagged" by the choice of the gradient magnetic fields.

An array of sampling antennae, numbered $n = 1, 2, \ldots, N$, which senses the direction and amplitude of electromagnetic response signals issued by the selected nuclei, is provided, where antenna number n in the array is activated to sense these signals only over a predetermined time interval, given by $t_{sig,n} < t < t_{sig,n} + \Delta t_{sig,n}$, that depends upon n. This particular nth time interval corresponds to receipt, at antenna number n, of the response signal that was issued by the excited selected nuclei in the predetermined time interval $t_{sig} < t < t_{sig} + \Delta t_{sig}$. Differences among these N time intervals may be compensated for by use of phase shifts, time delays or other similar adjustments in the response signals received.

Excitation of magnetization in the selected voxel volume elements can be accomplished by a number of approaches, including but not limited to the spin echo method, the echo planar method, the gradient recalled method, a backprojection method and various spectroscopic imaging techniques. All of these provide spatially resolved discrimination of this magnetization.

Selective sensing of the electromagnetic signals issued by the selected nuclei in the voxel volume elements is implemented by an array of antennae surrounding the tissue volume. The sequence of antenna activation time intervals $t_{sig,n} < t < t_{sig,n} + \Delta t_{sig,n}$ is chosen so that the sensing antenna number n is activated and senses the received or response signal RS (FID, spin echo or other resultant signal) that was issued by the selected magnetization in the tissue during the antenna's own activation time interval $t_{sig,n} < t < t_{sig,n} + \Delta t_{sig,n}$, within which it receives this response signal RS. Because the RS signal thus issued by the selected magnetization may require different amounts of time to reach each of the sensing antennae in the array, the times $t_{sig,n}$ and/or the time interval lengths $\Delta t_{sig,n}$ may differ from one antenna to another. If the sensing antennae are arrayed approximately on the circumference of a circle with the selected voxel volume elements positioned at the center, the parameters $t_{sig,n}$ and, separately, the parameters $\Delta t_{sig,n}$ may be approximately equal within each parameter set. If the sensing antennae are arrayed on two or more planes adjacent to the tissue these parameters may be quite different from one another with each parameter set.

The sensing antenna also serve as the source of the transmitted magnetic field $\underline{B}_1$ in one group of embodiments of the invention. In alternative embodiments, the transmitted magnetic field $\underline{B}_1$ is provided by a first array of antennae or other sources and the sensing antennae form a second, separate array to recover the response signal RS.

In all embodiments, the invention includes apparatus for producing nuclear magnetic resonance in a tissue and for sensing the RS signals induced in the selected nuclei in the tissue. In a first embodiment, the apparatus includes a dipole magnet, excited by current-carrying coils. The magnet substantially surrounds the patient's body and produces an approximately homogeneous magnetic field of specific field strength in the range 2-10 Tesla in a first (z) direction in the body. The apparatus includes an RF magnetic field source that produces a rotating magnetic field with approximately constant magnitude, with the magnetic field vector rotating in an xy-plane perpendicular to the z-direction with approximately constant angular frequency. The apparatus further includes a switched power source for the rotating magnetic field source so that this rotating magnetic field can be activated and deactivated during predetermined time intervals. The apparatus also has gradient magnetic field means for applying one or more additional gradient magnetic fields, over predetermined time intervals, to the tissue to excite selected magnetization in selected voxel volume elements in the tissue. The apparatus also includes an array of sensing antennae, positioned as a phased array adjacent to the tissue, to sense the RS signals issued by the selected magnetization. Several embodiments of these arrays are available. The apparatus further includes switching means connected to each sensing antenna to independently activate each antenna over a predetermined time interval so that each antenna senses the RS signals only over its own time interval.

Recall that the z-axis of the associated coordinate system is determined by the direction of the primary magnetic field $\underline{B}_0$ and that the magnetic field $\underline{B}_1(x,y,z,t)$ rotates in a plane that is perpendicular to the direction of $\underline{B}_0$. A second coordinate system is defined by three distinct planes relative to the human or animal body being examined: (1) a "transverse plane" TP that is oriented perpendicular to a longitudinal line that runs approximately parallel to the backbone of the body; (2) a "sagittal plane" SP that includes a longitudinal line of the body and includes a line that passes from the back to the front of the body; and (3) a "coronal plane" CP that includes a longitudinal line of the body and includes a line that passes from the right side of the body to the left side of the body. These three planes are illustrated in FIG. 1 and are defined by the body b itself. A transverse plane, sagittal plane or coronal plane may pass through the body or be positioned outside and adjacent to the body to which it refers.

In a first embodiment of the phased array of antennae, the primary magnetic field $\underline{B}_0$ is oriented perpendicular to a coronal plane and the $\overline{RF}$ magnetic field $\underline{B}_1(x,y,z,t)$ rotates in this coronal plane. Two antennae arrays, positioned in coronal planes located in front of and behind the body, provide an RF magnetic field $\underline{B}_1$. In a second embodiment, the primary magnetic field $\overline{\underline{B}}_0$ and the RF magnetic field $\underline{B}_1$ are oriented as in the first embodiment, but the $\overline{RF}$ magnetic field $\underline{B}_1$ is produced by a differently positioned array of antenna, located at the right side and left side of the body. In a third embodiment of the phased array of antennae, the primary magnetic field $\underline{B}_0$ is oriented perpendicular to a transverse plane and the RF magnetic field $\underline{B}_1$ rotates in this transverse plane. In a forth embodiment of the phased array of antennae, the primary magnetic field $\underline{B}_0$ is oriented perpendicular to a sagittal plane and the $\overline{RF}$ magnetic field $\underline{B}_1$ rotates in the sagittal plane.

In a general embodiment of the method invention, an approximately static, approximately homogeneous, primary magnetic field $\underline{B}_0$ oriented in a predetermined (z) direction is applied to the tissue, or to the interrogation volume of the tissue, and an RF magnetic field $\underline{B}_1(x,y,z,t)$, which rotates in a plane that is approximately perpendicular to the field vector $\underline{B}_0$, is applied over a first predetermined time interval given by $t_1 < t < t_1 + \Delta t_1$. A slice-select, gradient magnetic field $\underline{B}_2(z)$ is applied over a predetermined time interval given by $t_2 < t < t_2 + \Delta t_2$, in order to select a particular slice of the tissue. This gradient magnetic field $\underline{B}_2(z)$ is oriented parallel to the primary magnetic field $\overline{\underline{B}}_0$ but has much smaller magnitude and varies strictly monotonically with change in position in the z-direction. One or more additional gradient magnetic fields $\underline{B}_3(x,y)$, with field vector oriented parallel to the z-direction but changing with position in directions x and y in a plane perpendicular to the z-direction, is applied over a predetermined time interval given by $t_3 < t < t_3 + \Delta t_3$, in order to selectively excite voxel volumes within the chosen z-slice for study. The selected volume is excited by another RF rotating magnetic field and another gradient magnetic field, or by a gradient field alone, and a response signal is sensed at one or more phase arrays of antennae. The individual antennae receive the response signals RS at different times and compensate for this by means of internal phase shifts, time delays or other adjustments at the individual antennae that make up the array; these adjustments are used to focus the antenna array on the interrogation volume of interest. The resulting signals are then processed in order to properly analyze and display the response signals RS produced within the interrogation volume.

To evaluate and diagnose cardiac and other diseases of the heart and other organs and tissues non-invasively, a device that can image the anatomical structures with sub-millimeter resolution and that can view biochemical functions such as perfusion and metabolism with sub-centimeter resolution is provided. Diagnostic magnetic resonance imaging and spectroscopy, using RF focusing techniques and a high strength primary magnetic field, provide the improved signal-to-noise ratios that are required to achieve sub-millimeter spatial resolution and sub-centimeter localized spectroscopic signals. Focusing of the transmit and receive radiofrequency electromagnetic fields allows the volume of tissue from which response signals are sensed to be limited to a much smaller interrogation volume of interest, in order to reduce the energy deposited in the tissue by this radiation. Use of a plurality of sensing antennae, positioned in a phased array, allows an increase in the signal to noise ratio and allows a concomitant improvement in the data acquisition rate for the system.

BRIEF DESCRIPTION OF THE DRAWINGS

FIG. 1 illustrates typical transverse, sagittal and coronal planes of a body.

FIG. 2 is a flow chart illustrating the method invention generally.

FIG. 3 is a schematic view of the magnetic field configuration used in an embodiment of the invention.

FIGS. 4 and 5 illustrate the signal attenuation coefficient and characteristic wavelength, respectively, as a function of signal frequency, for one biological material of interest, canine muscle, an analog of human tissue.

FIGS. 6A, 7A and 8A are flow charts illustrating the steps in the invention when used together with the spin echo method (FIG. 6A), the echo planar method (FIG. 7A) and the gradient recalled method (FIG. 8A).

FIGS. 6B, 7B and 8B are graphs illustrating the sequence of magnetic fields used in the spin echo approach (FIG. 6B), the echo planar approach (FIG. 7B) and the gradient recalled approach (FIG. 8B) for selective excitation of a volume element according to the invention.

FIGS. 9A and 9B are front and side views illustrating one embodiment of the source of the rotating magnetic field $\underline{B}_1$, rotating or oscillating in a coronal plane, and sensing antennae for receipt of the RS signals.

FIGS. 10A and 10B are front and side views illustrating a second embodiment of the source of the rotating magnetic field $\underline{B}_1$, rotating or oscillating in a coronal plane, and sensing antennae for receipt of the RS signals.

FIGS. 11A and 11B are top and end views illustrating a third embodiment of the source of the rotating magnetic field $\underline{B}_1$, rotating or oscillating in a transverse plane, and sensing antennae for receipt of the RS signals.

FIGS. 12A and 12B are front and side views illustrating a fourth embodiment of the source of the rotating magnetic field $\underline{B}_1$, rotating or oscillating in a sagittal plane, and sensing antennae for receipt of the RS signals.

FIG. 13 is a front view illustrating the magnetic field apparatus that produces the fields used in implementing the invention shown in FIGS. 9A and 9B.

FIGS. 14A and 14B are front and to views illustrating an embodiment of magnetic field apparatus that produces the magnetic fields used in implementing the invention shown in FIGS. 10A and 10B.

FIGS. 15 (top view) and 16 (front view) illustrate the magnetic field apparatus used in implementing the inventions shown in FIGS. 11A/11B and 12A/12B.

FIG. 17 schematically illustrates the configuration used for focusing signals transmitted to a target element or for focused receipt of RS signals issued by the target volume element at the sensing antennae.

FIG. 18 schematically illustrates a configuration that is useful in obtaining focusing of magnetic fields at various positions along a line within a body.

FIGS. 19A and 19B are schematic views of an embodiment for mostly-analog signal processing of the response signals received from the excited selected nuclei in the interrogation volume.

FIGS. 20A and 20B are schematic views of an embodiment for mostly-digital signal processing of the response signals received from the excited nuclei in the interrogation volume.

DESCRIPTION OF BEST MODE

FIG. 2 is a flow chart illustrating the general method of the invention. The tissue, identified as 31 in FIG. 3, is placed in a static, homogeneous primary magnetic field $\underline{B}_0$, oriented in a first (z) direction in the laboratory frame, in the first step 11. A rotating magnetic field $\underline{B}_1(x,y,z,t)$ is applied in an xy-plane that is approximately perpendicular to the z-direction in the third step 13. The rotating magnetic field $\underline{B}_1$ has approximately constant magnitude and rotates with approximately constant angular frequency $\omega$ in the xy-plane. The primary and rotating magnetic fields may be represented approximately as $$\underline{B}_0 = B_0 \underline{i}_z,  \quad (3)$$

$$\underline{B}_1(x,y,z,t) = B_1(x,y,z)(\underline{i}_x \cos\omega t + \underline{i}_y \sin\omega t),  \quad (4)$$

where $\underline{i}_x$, $\underline{i}_y$ and $\underline{i}_z$ form a mutually orthogonal triad of unit length vectors, oriented in the x-, y- and z-directions in the rotating frame, respectively, where the z-direction coincides with the direction of the static primary field $\underline{B}_0$. The equations (1)–(4) are most easily analyzed in a rotating frame that rotates with the rotating magnetic field $\underline{B}_1(x,y,z,t)$, as discussed by Abragam, ibid. A slice-select gradient magnetic field $\underline{B}_2(z) = B_2(z)\underline{i}_z$ (amplitude varying with a coordinate, here z) is applied to the tissue approximately simultaneously with the RF magnetic field $\underline{B}_1$, to excite magnetization in selected voxel volume elements 33 in the interrogation volume (FIG. 2, step 12), shown in FIG. 3. The RF magnetic field $\underline{B}_1(x,y,z,t)$ is applied in a time interval given by $t1 < t < t1 + \Delta t1$.

FIG 3 illustrates the general configuration of the magnetic fields $\underline{B}_0$, $\underline{B}_1$ and $\underline{B}_2$ used to collectively excite magnetization in the selected slice or volume elements 33 in the tissue 31. The magnetic field vector $\underline{B}_2(z)$ is oriented in the z-direction, with amplitude $B_2(z)$ increasing (or decreasing) strictly monotonically as the coordinate z increases. The amplitude $B_2(z)$ may increase linearly with z, as a power law in z with $B_2(z) \propto z^a (a \neq 0)$, or in some other manner. The range of amplitudes of this third magnetic field $\underline{B}_2(z)$ is chosen so that the conditions for nuclear magnetic resonance are satisfied in a narrow z-slice, given by $z_2 < z < z_2 + \Delta z_2$, and this occurs over a predetermined time interval given by $t_2 < t < t_2 + \Delta t_2$.

Returning to FIG. 3, selective excitation of the selected particles in the selected voxel volume elements 33 of the tissue 31 is caused to occur over a predetermined time interval given by $t_1 < t < t_1 + \Delta t_1$, with $t_2 \leq t_1$, after which external excitation of the selected voxel volume elements by the field(s) $\underline{B}_1(x,y,z,t)$ ceases. In step 15, a time sequence of one or more gradient magnetic fields $\underline{B}_3(x,y)$, all with field vectors oriented in the z-direction, is applied to spatially encode the magnetization in the voxel volume elements 33, according to a desired phase shift or resonance frequency perturbation, as a function of the x- and/or y-coordinates. This occurs over a time interval given by $t_3 < t < t_3 + \Delta t_3$.

Another rotating magnetic field, $\underline{B}_5(x,y,z,t)$ (not required in some of the approaches discussed below), having the same angular frequency as $\underline{B}_1(x,y,z,t)$ but applied for a longer time interval or with a greater field amplitude, is then applied in step 16 to the tissue, in the presence of a gradient magnetic field. Magnetization in the voxel volume elements that were prepared by application of the preceding magnetic fields will cause issuance of electromagnetic response signals RS, in a time interval given by $t_{sig} < t < t_{sig} + \Delta t_{sig}$ (step 17). These voxel volume elements will provide the predominant response signals RS. A phased array of sensing antennae is then provided adjacent to the tissue 31 (FIG. 3) to sense the response signals RS issued by the selectively excited nuclei, as indicated by step 19. Each sensing antenna, numbered $n = 1, 2, \ldots, N$, in the phased array is activated for a particular time interval or "sense window" $W_n$, given by $t_{sig,n} < t < t_{sig,n} + \Delta t_{sig,n}$, during which the response signals RS produced in the selected interrogation volume element 33 (FIG. 3) in the time interval $t_{sig} < t < t_{sig} + \Delta t_{sig}$, arrive at antenna number n. Devices that provide controllable phase shifts or time delays of one signal relative to another, for example, electronically alterable phase shifters or mixers with variable local oscillator phases or time delays, may be used to controllably alter the signals transmitted by, or received at, the phased array of antennae. This allows focusing or steering of the signals in the interrogation volume, in a manner well known in propagation of electromagnetic signals, as part of the signal processing in step 21 in FIG. 2.

The interior of a human or animal body has many organs, tissues, fluids and other components, each with a characteristic set of material parameters, such as dielectric and magnetic permittivity, electrical conductivity, etc. Analysis of propagation of electromagnetic signals within such a body often uses a set of average parameters for purposes of evaluating signal attenuation and other material responses. Here, material response data on canine muscle, obtained from the publication by E. C. Burdette et al, "In-Situ Tissue Permittivity at Microwave Frequencies: Perspective, Techniques, Results", appearing in *Medical Applications of Microwave Imaging*, ed. by L. E. Larsen, I.E.E.E. Press, New York, 1986, pp. 13–40, were used to determined a suitable resonant frequency range for NMR imaging in such materials. Analysis of the Maxwell equations in a linear, isotropic, lossy, electromagnetic medium leads to solutions for the electric and magnetic field amplitudes E and B in one spatial dimension (r) of the form:

$$E, B \propto \exp[-(\alpha + j\beta)r + j\omega t], \quad (5)$$

$$(\alpha + j\beta)^2 = -\omega^2 \mu \epsilon' + j\omega\sigma\mu, \quad (6)$$

$\mu$ = magnetic permeability in tissue $\approx \mu_0 = 4\pi \times 10^{-7}$ Henry/meter, (7)

$\epsilon'$ = real part of complex dielectric permittivity in tissue, (8)

$\sigma$ = electrical conductivity (mho/meter) in tissue, (9)

r = spatial coordinate measured in wave propagation direction, (10)

where $\epsilon'$ and $\sigma$ may be frequency-dependent. Physically realistic solutions of Eq. (4) are:

$$\alpha = [\omega^2 \mu \epsilon'/2]^{\frac{1}{2}}[[1 + \tan^2 \delta]^{\frac{1}{2}} - 1]^{\frac{1}{2}}, \quad (11)$$

$$\beta = [\omega^2 \mu \epsilon'/2]^{\frac{1}{2}}[[1 + \tan^2 \delta]^{\frac{1}{2}} + 1]^{\frac{1}{2}}, \quad (12)$$

$$\tan \delta = \sigma/\omega\epsilon'. \quad (13)$$

The quantity $\lambda = 2\pi/\beta$ serves as an effective wavelength for an undulating wave in the spatial coordinate r, the quantity $v = \omega/\beta$ services as the phase velocity for this wave, and the quantity $\alpha' = 20 \log_{10}[\alpha]$ (in dB/cm) serves as an exponential attenuation coefficient for a wave of temporal frequency $f = \omega/2\pi$ propagating through the material. FIG. 4 and 5 present the results of calculations of $\alpha'$ and $\lambda$, using interpolations of the experimental data of Burdette et al, supra, for 17 frequencies shown in Table 1, ranging from 14.9 MHz to 340.6 MHz. For NMR imaging of protons with $\gamma = 42.57$ MHz/Tesla, these 17 frequencies correspond to primary magnetic field strengths $B_0$ of 0.35 Tesla to 8 Tesla, as indicated in Table 1. For proton NMR, primary magnetic field strengths $B_0$ of 3 Tesla to 8 Tesla produce wavelengths $\lambda$ in the range of 11.3 cm ($B_0 = 8$ Tesla) to 30 cm ($B_0 = 3$ Tesla), with corresponding signal attenuation coefficients $\alpha'$ of 1.95 dB/cm (8 Tesla) down to 1.4 dB/cm (3 Tesla). This is an attractive range of wavelengths $\lambda$ for NMR imaging of protons, and the corresponding range of signal attenuation coefficients $\alpha'$ is acceptable for path lengths in the body of no more than 20 cm. Thus, for NMR imaging of protons in material such as canine muscle, primary field strengths $B_0 = 3-8$ Tesla, corresponding to resonant frequencies $f_0 = \gamma B_0$ of 127.7 MHz – 340.6 MHz, are quite attractive for this purpose. For studies in humans or animals, the range of primary magnetic field strengths will be similar, but not necessarily identical, and will cover a total range of primary magnetic field strengths $B_0 = 2-10$ Tesla.

TABLE 1

Material Parameters For Canine Muscle Versus Frequency

| B0 (Tesla) | Frequency | $\alpha'$ (dB/cm) | $\lambda$(cm) | $\epsilon'/\epsilon_0$ | $\sigma$(mho/meter) |
|---|---|---|---|---|---|
| 0.35 | 14.9 MHz | 0.53 | 88.2 | 161 | 0.72 |
| 0.5 | 21.3 | 0.66 | 71.6 | 125 | 0.75 |
| 1.0 | 42.6 | 0.92 | 46.6 | 90.1 | 0.83 |
| 1.5 | 63.9 | 1.08 | 36.2 | 80.2 | 0.88 |
| 2.0 | 85.1 | 1.21 | 30.9 | 73.1 | 0.88 |
| 2.5 | 106.4 | 1.31 | 26.4 | 65.7 | 0.85 |
| 3.0 | 127.7 | 1.40 | 23.6 | 60.2 | 0.82 |
| 3.5 | 149.0 | 1.47 | 21.4 | 56.9 | 0.81 |
| 4.0 | 170.3 | 1.54 | 19.6 | 54.9 | 0.81 |
| 4.5 | 191.6 | 1.61 | 18.6 | 53.6 | 0.83 |
| 5.0 | 234.1 | 1.67 | 16.8 | 52.7 | 0.85 |
| 5.5 | 234.1 | 1.72 | 15.7 | 52.7 | 0.87 |
| 6.0 | 255.4 | 1.77 | 14.7 | 51.5 | 0.88 |
| 6.5 | 276.7 | 1.82 | 13.5 | 51.1 | 0.90 |
| 7.0 | 298.0 | 1.87 | 12.7 | 50.8 | 0.91 |
| 7.5 | 319.3 | 1.91 | 12.0 | 50.5 | 0.92 |
| 8.0 | 340.6 | 1.95 | 11.3 | 50.2 | 0.93 |

To form medical images of targets such as organs and tissues within a living being, magnetic resonance imagining techniques will be used. A description of some of these techniques follows. A selected voxel volume element of the tissue can be excited in a predetermined time interval by use of certain time-dependent gradient magnetic fields to produce the conditions required for such resonance in, or adjacent to, that volume element. One such method, the spin echo method, is discussed by L. E. Crooks in "An Introduction to Magnetic Resonance Imaging", I.E.E.E. Engrg. in Med. and Biol., vol. 4 (1985) pp. 8–15, incorporated herein by reference, and proceeds as follows.

With reference to FIG. 6A, the tissue to be imaged is prepared by placing it in a static, approximately homogeneous magnetic field $B_0$ and simultaneously applying an RF rotating magnetic field $\underline{B}_1(x,y,z,t)$ in the xy-plane and a z-slice select gradient magnetic field $\underline{B}_2(z)$, which may have the form $\underline{B}_2(z) = G_z z i_z$ or any other form that is monotonically increasing in z. The field $\underline{B}_1$ is often referred to as a "90° pulse" in the spin echo method.

Another gradient magnetic field $\underline{B}_3(y)$ is introduced, with field vector oriented along the z-direction and field strength increasing monotonically (e.g. linearly) in the y-direction. The range of field strengths of this fourth magnetic field $\underline{B}_3$ is chosen so that the conditions for resonance within the z-slice are the same within narrow y-slices given by $y_3 < y < y_3 + \Delta y_3$, and this occurs only over a predetermined time interval given by $t_3 < t < t_3 + \Delta t_3$. Each of these narrow y-slices has a different characteristic phase shift associated with it because the local magnetic field at each voxel volume element is slightly different. This phase shift changes monotonically (e.g., linearly) with change in the position coordinate y. Another gradient magnetic field $\underline{B}_4(x)$ is introduced, with field vector in the z-direction and field strength increasing monotonically (e.g., linearly) in the x-direction. The conditions for resonance are satisfied within narrow x-slices given by $x_4 < x < x_4 + \Delta x_4$, and this occurs only over a predetermined time interval given by $t_4 < t < t_4 + \Delta t_4$, with $t_3 + \Delta t_3 \leq t_4$. The appropriate frequency associated with each narrow x-slice changes with change of the position coordinate x. The amplitudes $B_3(y)$ and $B_4(x)$ of the fourth and fifth gradient magnetic fields are strictly monotonically increasing (or decreasing) in the indicated coordinates y and x, respectively.

A sixth rotating magnetic field $\underline{B}_5(x,y,z,t)$, with longer duration or a greater amplitude than the field $\underline{B}_1$, is applied at a predetermined time $T_E/2$ after application of the fifth magnetic field $\underline{B}_4(x)$ and is often referred to as a "180 degree pulse". Application of the field $\underline{B}_5$ reverses the sense of increasing phase in the selected nuclei. At a determinable time $T_E$ after application of the field $\underline{B}_1$, a response signal RS issues from the previously excited selected nuclei within the original z-slice. This response signal is often referred to as a spin echo signal.

The fourth, fifth and sixth magnetic fields are repeatedly applied a predetermined total of M times, with the magnitude of the fourth or phase encode magnetic field $|B_3(y)|$ being incremented by a fixed amount with each repetition. After the fourth, fifth and sixth magnetic fields have been applied, response signals RS issue from the selectively excited volume element, and these signals can be sensed by an adjacent phased array of coils or antennae.

The product of the magnitude of the rotating magnetic field $\underline{B}_1$ and the time over which this field is applied is chosen so that the magnetization vector $\underline{M}$ is "tipped" from its initial orientation along the z-axis by a reorientation or tipping angle $\theta$. The magnetization vector $\underline{M}$ lies in the xy-plane after application of the field $\underline{B}_1(x,y,z,t)$, corresponding to the tipping angle $\theta = 90°$. In a similar manner, the RF field $\underline{B}_5(x,y,z,t)$ is chosen to achieve a tipping angle of 180°. The spin echo method, used together with the method of the invention, is illustrated in a flow chart in FIG. 6A, with the sequence of magnetic fields applied being illustrated in FIG. 6B. The manifold of spin echo signals is processed into a useful image using two-dimensional Fourier transforms of response signals RS.

In the echo planar method, first discussed by P. Mansfield and I. L. Pykett in Jour. of Mag. Resonance, vol. 29 (1978) pp. 355-373 and incorporated herein by reference, the rotating RF magnetic field $\underline{B}_1$ for a $\theta = 90°$ pulse and the z-gradient magnetic field $\underline{B}_2(z)$ are switched on during the same time interval, then switched off. FIG. 7A shows in flow chart form the steps followed in this version of the echo planar method. A steady x-gradient magnetic field $\underline{B}_4(x)$ is established for a second time interval of length 4 m (m = 1, 2, 3, . . . ), where $\tau$ is predetermined, and the y-gradient magnetic field $\underline{B}_3(y)$ is established and periodically reversed during this second time interval, as shown in the graphical views of the echo planar magnetic pulse sequences in FIG. 7B. This sequence may be repeated to improve signal definition, but a single such sequence allegedly provides all information for a two-dimensional scan of a slice defined by the z-gradient magnetic field $\underline{B}_2(z)$. In anther version, 180° pulses are provided to produce spin echos by periodically reversing the x-gradient magnetic field $\underline{B}_4(x)$.

The gradient recalled method, illustrated in flow chart form in FIG. 8A, proceeds in a manner similar to that of the spin echo method with the following differences. First, the amplitude of the slice-select gradient magnetic field $\underline{B}_2 = \underline{B}_2(z,t)$ is initially positive (or negative) and then changes sign before the field disappears, with the time integral of the field $\underline{B}_2$ over the time interval of application being zero. Second, the amplitude of the frequency encode gradient magnetic field $\underline{B}_4 = \underline{B}_4(x,t)$ also changes sign at a predetermined time, and the integral over the time for which this field is applied is zero. Third, the product of the magnitude of the rotating magnetic field $\underline{B}_1$ and the time over which this field is applied is such that the magnetization vector is not tipped by $\theta = 90°$ into the xy-plane, but is tipped by a smaller angle that is usually no more than $\theta = 20°$. FIG. 8B illustrates the sequence of magnetic field amplitudes used to implement the invention, when used together with the gradient recalled method. The gradient recalled method is discussed by A. Haase et al in "FLASH Imaging. Rapid NMR Imaging Using Low Flip-Angle Pulses", Jour. of Mag. Resonance, vol. 67 (1986) pp. 258-266, which is incorporated herein by reference.

Another useful method is the convolution/backprojection method, discussed by P. D. Lauterbur in "Imaging Formation by Induced Local Interactions; Examples Employing Nuclear Magnetic Resonance", Nature, vol. 292 (1973) pp. 190-191, and by L. Axel et al in "Linogram Reconstruction for Magnetic Resonance Imaging", I.E.E.E. Trans. in Medical Imaging, vol. 9 (1990) pp. 447-449, incorporated by reference herein.

FIGS. 9A and 9B illustrate a top view and side view, respectively, of one embodiment of the source (the "applicator") of the rotating or oscillating RF second magnetic field $B_1(x,y,z,t)$ according to the invention. In these figures, the tissue 71 is shown in outline as a human form for definiteness, but any other reasonable form could also be used. The primary magnetic field $B_0$ is oriented perpendicular to the coronal plane in the top view in FIG. 9A so that the field vector points from back to front (or from front to back), as shown in FIG. 9B. The applicator includes two plates 73 and 75, each containing an array of open waveguides, stripline antenna or similar sources ("antennae") that produce a focused sum of magnetic fields $\underline{B}_1$ that rotates approximately in a plane parallel to the applicator plates at approximately constant angular frequency.

The rotating magnetic field $\underline{B}_1$ may be replaced in any of the embodiments discussed herein by a magnetic field $\underline{B}_1$ that oscillates in a single direction lying in the rotation plane. For convenient reference, a rotating magnetic field $\underline{B}_1$ (corresponding to circular polarization) and a uni-directional oscillating magnetic field $\underline{B}_1$ (corresponding to linear polarization) will be collectively referred to here as a "rotating magnetic field".

Referring again to FIG. 9A, the two sections 73 and 75 of the applicator may each have a fluid or solid 77, positioned between the applicator section and the outer boundary of the tissue 71, that approximately matches the average complex impedance of the tissue material at the angular frequency $\omega$ applied by the focused rotating magnetic field $\underline{B}_1$. This "impedance-matching material" 77 may be water, physiological saline, gels or other suitable material. Alternatively, the tissue 71 could be completely immersed in the impedance-matching material, as discussed by S. J. Foti et al in "A Water Immersed Phased Array System for Interrogation of Biological Targets", published in *Medical Applications of Medical Imaging*, ed. by L. E. Larsen, I.E.E.E. Press, 1986, New York, pp. 148-166. Preferably, the applicator sections should be positioned as close to the tissue 71 as possible, within 5 cm thereof or even contacting the target, in order to reduce the signal loss that occurs in transmission of an electromagnetic signal between applicator and tissue 71.

The applicator sections 73 and 75 are connected to a switched power supply 78 that activates and deactivates the applicator during predetermined time intervals, as discussed above. A source of the primary magnetic field $\underline{B}_0$ and of the gradient magnetic fields, all oriented in the same direction as $\underline{B}_0$, may be provided as shown in FIGS. 13, 14A/14B, 15 and 16 for the respective embodiments shown in FIGS. 9A/9B, 10A/10B, 11A/11B and 12A/12B. The source of the gradient magnetic fields in FIGS. 9A/9B may be connected to a switched power supply 79 that activates and deactivates the gradient magnetic fields during predetermined time intervals. The array of antennae that serves as source of the focused rotating magnetic field $\underline{B}_1$ may also serve as the array of focused sensing antennae used to sense the RS signals issued by nuclei in the selected voxel volume elements of the tissue 71. A plurality of phased transmitters to individually phase shift the signals $\underline{B}_1(x,y,z,t)$ transmitted from the antenna would be required here.

FIGS. 10A and 10B illustrate another embodiment of the applicator, in top view and side view, respectively. The tissue 81 is partly surrounded by two components 83 and 85 of the applicator, both of which are connected to one or a plurality of switched power sources 88. The primary magnetic field $\underline{B}_0$ is again perpendicular to the coronal plane and is directed from back to front, or from front to back, as shown. The two applicator components 83 and 85 together provide a rotating magnetic field $\underline{B}_1(x,y,z,t)$ that rotates with approximately constant angular frequency $\omega$ parallel to a coronal plane passing through the tissue from the left side to the right side. Optionally, the volume between the tissue 81 and the applicator components 83 and 85 may be filled with an impedance-matching fluid or solid 87 that matches the relevant electromagnetic properties of the tissue material. A switched power supply 88 provides power for the rotating magnetic field sources 83 and 85. Another switched power source 89 provides power for the gradient fields, whose field vectors are parallel to $\underline{B}_0$. Optionally, the sources for the focused magnetic field $\underline{B}_1$ may also serve as the sensing antennae for the RS signals issued by selectively excited nuclei in the selected voxel volume elements in the tissue.

FIGS. 11A and 11B illustrate a third embodiment, in top view and end view, respectively, of one applicator according to the invention. The tissue 91 is surrounded by a plurality of coils or other RF magnetic field sources 93A, 93B, ..., 93F, 93G, etc. that are part of the applicator. These sources together produce a focused rotating magnetic field $\underline{B}_1$, best shown in the end view in FIG. 11B, that rotates in a transverse plane with approximately constant angular frequency $\omega$. Another magnetic field source (not shown) produces the primary magnetic field $\underline{B}_0$ that is oriented perpendicular to this transverse plane in this embodiment. The sources for the rotating magnetic field $\underline{B}_1$ and for the gradient magnetic fields are powered by a plurality of switched power supplies 98 and a switched power supply 99, respectively. Optionally, the volume between the applicator components and the edge of the tissue may be filled with an impedance-matching fluid or solid 97, as in the embodiments illustrated in FIGS. 9A, 9B, 10A and 10B. Optionally, the array of components 93A, 93B, etc. that serve as the sources for the focused magnetic field $\underline{B}_1$ may also serve as sensing antennae for sensing the $\overline{RS}$ signals issued by the selectively excited particles in the selected voxel elements of the tissue 91.

FIGS. 12A and 12B are top and side views, respectively, of a fourth embodiment of the applicator according to the invention. The tissue 101 has two plates 103 and 105, positioned near the front and back surfaces of the patient or tissue, that serve as part of the applicator. The plates 103 and 105 contain a plurality of antennae that produce a focused magnetic field $\underline{B}_1$ that rotates in a sagittal plane within the tissue 101. The primary magnetic field $\underline{B}_0$ has its field vector directed perpendicular to this sagittal plane within the tissue. A plurality of switched power supplies 108 and 109 provides power for the focused rotating magnetic field $\underline{B}_1$ and for the gradient magnetic fields, respectively, as discussed above. Optionally, an impedance-matching fluid or solid 107 may fill the volume between the plates 103 and 105 and the target 101, as done in the embodiments of the applicator shown in FIGS. 9A, 9B, 10A, 10B, 11A and 11B. Optionally, the plurality of coils or other sources contained in the plates 103 and 105 may also serve as the sensing antennae for the RS signals issued by the selectively excited nuclei within the selected voxel volume elements of the tissue 101.

FIG. 13 illustrates a front view of one embodiment of apparatus useful in producing the magnetic fields required by the invention shown in FIGS. 9A and 9B. The useful interrogation volume that can be selectively excited by this apparatus, operating at a primary field strength of 2–10 Tesla, is about 500–3,000 cm$^3$ but may be made larger if desired. A dipole magnet having a yoke 41 of suitable material is provided with a sequence of coils 43a and 43b, preferably superconducting, to produce the primary magnetic field $\underline{B}_0$, which is perpendicular to a coronal plane in this embodiment. The focused rotating magnetic field is provided by a phased array 44 of antennae, positioned in two coronal planes adjacent to the body or tissue 53, that produce a magnetic field vector $\underline{B}_1(x,y,z,t)$ that rotates at an approximately constant angular frequency $\omega$ in a coronal plane, as seen in top view in FIG. 9A. Power for producing the magnetic field $\underline{B}_1$ is provided by one or a plurality of switched power supplies 45. Gradient coils 47, 48 and 49 provide the supplemental magnetic field or fields $\underline{B}_2$, $\underline{B}_3$ and/or $\underline{B}_4$ for excitation of the selected voxel volume elements and are connected to another switched power supply 46. An optional pole piece 51 provides flux concentration for the primary magnetic field $\underline{B}_0$. The body or tissue 53 is optionally supported on a tissue support 55 that can be transported into and out of the primary field region 57 for the apparatus.

FIGS. 14A and 14B are front and top views of an embodiment of apparatus useful in producing the magnetic fields required by the invention shown in FIGS. 10A and 10B. The apparatus shown in FIGS. 14A and 14B operates in a manner similar to the apparatus shown in FIG. 13. The primary magnetic field $\underline{B}_0$ is again perpendicular to a coronal plane in this embodiment. The focused rotating or other time-dependent magnetic field $\underline{B}_1(x,y,z,t)$ is provided by a phased array 44' of coils or antennae, positioned in two sagittal planes adjacent to the body or tissue 53, that produce a magnetic field vector $\underline{B}_1$ that rotates at an approximately constant angular frequency $\omega$ in a coronal plane, as seen in the top view in FIG. 10A. Power for producing the magnetic field $\underline{B}_1$ is provided by a plurality of switched power supplies 45. Gradient coils 47, 48 and 49 provide the supplemental magnetic field or fields $\underline{B}_2$, $\underline{B}_3$ and/or $\underline{B}_4$ for excitation of the selected voxel volume elements and are connected to other switched power supplies 46. An optional pole piece 51 provides flux concentration for the primary magnetic field $\underline{B}_0$. The body or tissue 53 is optionally supported on a tissue support 55 that can be transported into and out of the primary field region for the apparatus.

Another embodiment is illustrated in the top view of FIG. 15, in which the magnetic coils 43a and 43b produce a primary magnetic field $\underline{B}_0$ that is perpendicular to a transverse plane within the body or tissue 53. A focused rotating magnetic field $\underline{B}_1(x,y,z,t)$ that rotates in this transverse plane is produced by a circumferential assembly of longitudinally-oriented coils or antennae 59. This embodiment corresponds to the applicator embodiment shown in FIGS. 11A and 11B. Power for the rotating and gradient magnetic fields comes from switched power supplies 45 and 46.

FIG. 16 illustrates an embodiment of the magnetic field apparatus that is useful in providing the fields used in the embodiment of the applicator shown in FIGS. 12A and 12B. The coils 43a' and 43b' have been rotated by 90° from their orientation in FIGS. 13 and 14A to produce a primary magnetic field $\underline{B}_0$ that is perpendicular to a sagittal plane of the patient. The sources 47', 48' and 49' of the gradient magnetic fields have also been rotated by 90° to produce gradient magnetic fields parallel to $\underline{B}_0$. The focused rotating magnetic field $\underline{B}_1$ is provided by the antennae 44''.

FIG. 17 illustrates the desired focusing or steering of excitation signals transmitted by a linear array of transmitters $A_1, A_2, \ldots, A_N$, located at positions that need not be equidistantly spaced. The distanced of interrogation volume element S to its perpendicular "foot", indicated as F, on the line containing the linear array of transmitters is taken to be h, and the distance from the foot F to the nth transmitter $A_n$ is taken to be $d_n$. The total phase shift $\psi_n$, including propagation delay for a signal of effective wavelength $\lambda$ that travels from the transmitter, through a phase shifter, to an array element $A_n$, to the interrogation volume element S, or in the reverse direction, becomes $$\psi_n = 2\pi R_n \lambda + \phi_n, \tag{14}$$

$$R_n = [h^2 + d_n^2]^{\frac{1}{2}}, \tag{15}$$

$\phi_n$ = phase shift introduced internally at transmitter number n. (16)

In order to achieve focusing or steering at the interrogation element S, it is desirable that $$\psi_1 = \psi_2 = \ldots = \psi_N \pmod{2\pi}, \tag{17}$$

which can be achieved by arranging that the internal phase shift $\phi_n$ introduced at the array element $A_n$ satisfies the relation $$\phi_n - \phi_m = (2\pi/\lambda)(R_m - R_n) \pmod{2\pi} \ (m,n=1,2,\ldots,N) \tag{18}$$

If a signal, issued at the interrogation volume element S, is to be coherently received rather than transmitted at an array of antenna receivers, also indicated as $A_1, A_2, \ldots, A_N$ in FIG. 17, the associated phase shifts $\phi'_m$ and $\phi'_n$ impressed at the receivers $A_m$ and $A_n$, respectively, should also satisfy Eq. (18). The phase shifts $\phi'_n(=\phi_n)$ for transmission and/or reception for the phased array of antennae $\{A_n\}$, shown in FIG. 17, can be introduced electronically and will vary with the location of the interrogation volume element S. However, these phase shifts can also be introduced in the software used to process signals to be transmitted or received at the antenna $\{A_n\}$, and this is the preferred approach for the invention.

S. J. Foti et al, supra, have discussed provision of a phased array of transmitters or receivers at frequencies 20 times as high (~3 GHz) as those of interest here, with the transmitting or receiving elements spaced equal distances apart and with the interrogation volume element S effectively located at infinity (h infinite). The mathematics used with the invention disclosed here is somewhat more complex because h is finite, and the same electronic components can be used for both transmitting the rotating magnetic field signals $\underline{B}_1(x,y,z,t)$ and for sensing the RS signals received from the interrogation volume element S that is selectively excited.

FIG. 17 illustrates focusing on the interrogation volume by a one-dimensional array of transmitting and/or receiving elements, arranged along a line LL'. A one-dimensional array of such elements may also be positioned along a curvilinear path, such as a circle, ellipse, hyperbola or parabola. More often, use of a two-dimensional array of transmitting and/or receiving elements is appropriate; and in this instance the elements may be positioned at the vertices of: (1) a rectangular lattice; (2) a regular hexagonal lattice; (3) an equilateral triangular lattice; (4) a lattice of non-equilateral triangles; or (5) some other appropriate two-dimensional lattice, on a planar or curved surface. The transmitting and/or receiving elements can also be formed as two or more annular arrays of such elements AR1, AR2 and AR3, as shown in FIG. 18, in order to provide focusing of the excitation RF signals or response signals RS at a position along a line LL' that passes through the body.

In performing magnetic resonance imaging by focusing of the selective excitation signal or focused pick-up of the RS signal, use of the gradient magnetic fields allow resolution of structures of the size of voxel volumes. Focusing the array of RF signals allows resolution of a structure the size of the interrogation volume. Movement of the transmitter or receiver plane in an axial direction, as recommended by Foti et al, supra is not required for three-dimensional selective excitation or signal pick-up according to the invention.

FIG. 19 illustrates one embodiment of a signal processor that can be used to process the response signals RS received by the array of antennae $A_n$ shown in FIG. 17. When the apparatus operates in the receiver mode, response signals RS1, RS2, RS3, ..., RSN arrive on their respective signal lines at N transmitter/receiver switches T/R1, T/R2, ..., T/RN and are passed along N receiver path signal lines to N signal amplifiers 201, 202, ..., 20N, respectively. The transmitter/receiver switches T/Rn are used to protect sensitive circuits from damage by high power pulses. The output signals that issue from each of the N amplifiers 201, 202, ..., 20N are split and sent along N signal lines to an assembly of heterodyne receivers $21n-m$ (n=1, 2, ..., N; m=1, 2, ..., M, with M=3 in this example), each with its own associated local oscillator ("LO"), $22n-m$. Each heterodyne receiver $21n-m$ produces an output signal with much lower output frequency but with phase angle preserved, after appropriate filtering, and the heterodyne output signals are passed to phase shift devices $23n-m$. The phase shift device $23n-m$ introduces a controllable phase shift $\phi_{n,m}$ into the received response signal passing through that phase shift device. Thus, for example, the phase shift devices 231-1, 232-1 and 233-1 introduce phase shifts $\phi_{1,1}$, $\phi_{2,1}$ and $\phi_{3,1}$ into the respective output signals that issue from these three devices; and these three output signals are combined in a summing device 251 whose output signal is the sum of the N input signals RS1, RS2, ..., RSN, suitably phase shifted. Alternatively, the phase shift devices $21n-m$ may be deleted and the desired phase shifts may be introduced through the controllable phase shifts in the local oscillator signals from the LOs. The phase-shifted output signals from the summing devices 251, 252 and 253 are received by analog-to-digital converters ("ADCs") 261, 262 and 263, respectively, and the output signals from these ADCs, after appropriate post-processing, represent a particular physically determinable parameter associated with the interrogation volume of the tissue, such as density of the selected nuclei, the spin-lattice relaxation time T1, the spin-spin relaxation time T2, a local diffusion constant for a voxel volume element, or some spectroscopic parameter. Such a physically determinable parameters can be represented as a spatially resolved quantity. Any parameter associated with a voxel volume element that can be measured using this approach will be referred to as a "characterizing parameter" here. The embodiment of phased array signal processing may be used with any array of two or more receivers for the response signals RS.

When the apparatus shown in FIG. 19 is used as a transmitter rather than as a receiver, a master oscillator ("MO") 280 with a predetermined output signal frequency produces an oscillating output signal that is received by each of N phase shift devices 281, 282, ..., 28N that introduce N predetermined phase shifts $\phi_{1,j}$, $\phi_{2,j}$, ..., $\phi_{N,j}$ into the MO signal. These phase shifted signals are then directed through N signal amplifiers 291, 292, ..., 29N, the amplified output signals are sent through the respective transmitter/receiver switches T/R1, T/R2, ..., T/RN, and the transmitter/receiver output signals are transmitted by the respective antennae $A_1, A_2, \ldots, A_N$. This process is repeated for $J-1$ additional sets of phase shifts $\phi = \phi_{n,j}$ ($j=2, \ldots, J$) to selectively excite J different interrogation volumes.

The phase shifted antenna output signals are focused on a particular interrogation volume in this transmitter mode, in order to selectively excite that selected volume. Alternatively, the phase shifts $\phi_{n,j}(n=1, 2, \ldots, N)$ may be deleted and the body or tissue may be bathed in magnetic radiation, to non-selectively excite the whole body. Selective excitation of an interrogation volume is preferred here, for two reasons. First, irradiation of the whole body or tissue should be limited to the specific portion being examined, in order to limit the energy deposition and consequent heating to that specific portion. Second, indiscriminate excitation of nuclear magnetic resonance in the body as a whole will produce undesired response signals from regions that are of no interest, and these unwanted response signals must be filtered or otherwise canceled in order to examine the response signals from the interrogation volume of interest.

Additional computer processing, including signal storage, computation of two-dimensional Fourier transforms and other image processing in a memory and Fourier transform module 271 is optionally provided to complete the signal processing. A suitable image display 273 may also be provided to visually display the processed images.

The signals configuration of FIG. 19 is useful if the phase shift devices $23n-m$ and the summing devices 25m are relatively inexpensive and if most of the processing is to be done for signals in analog form. If, in the other hand, most of the processing is to be done for signals in digital form, or if a phase device or signal summing device is relatively expensive, another configuration, shown in FIG. 20, may be used for processing of the responsive signals RS. In the receiver mode, the response signals RS1, RS2, ..., RSN arrive at the respective antennae $A_1, A_2, \ldots, A_N$ and are sent along their respective signal output lines to signal amplifiers 301, 302, ..., 30N, respectively. The amplified response signals RS1, RS2, ..., RSN are received and processed by heterodyne receivers 311, 312, ..., 31N and their associated local oscillators 321, 322, ..., 32N, respectively, to reduce the effective carrier frequencies to the dc-to-kHz range. The heterodyne receiver output signals are passed through ADCs 331, 332, ..., 33N, respectively. The output signals of the ADCs 331, 332, ..., 33N are received by memory modules 341, 342, ..., 34N, respectively, of a memory unit. The memory module 341 receives and temporarily stores a sequence of samples of the response signal RS1, taken at different times, for subsequent processing. In a similar manner, the memory modules 34n (n=2, 3, ..., N) each receive and temporarily store a sequence of samples of the response signal RSn.

A first sequence of phase shifts $\phi = 100_{n,1}$ (n=1, 2, ..., N) is determined and loaded into phase shift compensation devices 35n that may be part of the memory units 34n, and each sequence of response signal samples RSn held in the memory modules 34n is sent through the phase shift compensation device 35n to impress a selected phase shift $\phi = \phi_{n,1}$ or a corresponding time delay on that sequence. Alternatively, these phase shifts can be impressed on the response signals RSn being processed by deleting the phase shift compensation devices 35n and introducing the desired phase shifts through controllable phase shifts in the local oscillator signals. The phase-shifted output signals are then sent to a signal summing device 361, and a first sum signal OS1 issues that represents a magnetic resonance response signal received from a first selected interrogation volume. This process is repeated with $J-1$ additional sets of determined phase shifts $\phi = \phi_{n,j}$ (j=2, 3, ..., J; n=1, 2, ..., N) to produce $J < 1$ additional sum signals OSj, representing $J-1$ other selected interrogation volumes. The collection of sum signals OS1, OS2, ..., OSJ represents the response signals issued by the different selected interrogation volumes. Note that, beyond the memory unit, signal processing may be done "off-line" because the response signal samples are fixed in the memory modules. The signal processing embodiment shown in FIG. 20 allows off-line signal processing, requires only N phase shift devices 35n and one signal sum device 361 to be provided for the processing, and allows most of the processing to be performed on the signals in digital form. If the response signals RS are to be phase shifted and processed in parallel, the entire signal processing module 367 shown in FIG. 20 may be reproduced a suitable number of times and these signal processing modules may be operated simultaneously to produce the desired images of the interrogation volumes.

Operating in the transmitter mode, the apparatus of FIG. 20 begins with an oscillatory signal produced by a master oscillator 370 and deliver the MO output signal to an array of phase shift devices 371, 372, ..., 37N that impresses a first sequence of predetermined phase shifts $\phi_{n,1}$ on these output signals. The phase shifted MO output signals are amplified by a power amplifier 38$n$ and are then passed to the respective antennae $A_1$, $A_2$, ..., $A_N$ for transmission as a focused beam. This process continues for each sequence of chosen transmission phase shifts $\phi = \phi_{n,j}(n = 1, 2, ..., N; j = 1, 2, ..., J)$, with each such sequence of phase shifts causing the transmitted magnetic field signals to focus on a selected interrogation volume. Again, if the body or tissue is to be uniformly bathed in the rotating magnetic field signal, the phase shift devices 371, 372, ..., 37N may be deleted.

I claim:

1. A method of medically imaging a selected interrogation volume element of size no larger than 3,000 cm$^3$ in a tissue of a human or animal with increased signal-to-noise ration, the method comprising the steps of:

(1) applying a temporally static, spatially homogeneous first magnetic field $\underline{B}_0$ that has a magnetic field oriented in a predetermined first or z-direction with associated first position coordinate z to orient the magnetization vector of selected nuclei parallel to the first direction;

(2) applying a plurality of radiofrequency second magnetic fields $\underline{B}_1$ to the tissue, with each such field having a field direction that rotates with a predetermined angular frequency $\omega$ in a rotation plane that is approximately perpendicular to the z-direction, where the angular frequency $\omega$ is at least $10^5$ radians per second and these second magnetic fields $\underline{B}_1$ being applied over a predetermined time interval given by $t_1 < t < t_1 + \Delta t_1$ to reorient the magnetization vector of the selected nuclei at a predetermined reorientation angle $\theta$ relative to the first direction, application of the second magnetic fields $\underline{B}_1$, and with the fields $\underline{B}_1$ being applied to focus the sum of the fields $\underline{B}_1$ in a selected interrogation volume of size no larger than 3,000 cm$^3$;

(3) applying a third magnetic field $\underline{B}_2(z)$, which is a gradient field, to the tissue over a predetermined time interval given by $t_2 < t < t_2 + \Delta t_2$ where $t_2 \leq t_1$, the field having a field vector oriented in the z-direction with an amplitude $B_2(z)$ that increases strictly monotonically with change of the position coordinate z;

(4) applying one or more additional gradient magnetic fields, with field vectors oriented in the z-direction and with magnetic field amplitudes changing with position in a plane that is perpendicular to the z-direction, to the tissue to preferentially condition selected voxel volume elements so that nuclei of a selected chemical element within one or more of the selected voxel elements are in magnetic resonance;

(5) allowing the selected nuclei in the selected voxel elements to issue electromagnetic signals in a time interval given by $t_{sig} < t < t_{sig} + \Delta t_{sig}$, in response to excitation of these nuclei;

(6) providing a phased array of at least two sensing antennae, numbered $n = 1, 2, ..., N$, that sense the direction and amplitude of electromagnetic signals issued by the selected nuclei in the selected voxel elements, where antenna number n in the array is activated to sense these electromagnetic signals over a predetermined time interval given the array of sensing antennae of electromagnetic signals issued by the selected nuclei in the selected voxel elements in the time interval given by $t_{sig} < t < t_{sig} + \Delta t_{sig}$; and (7) processing these electromagnetic signals received at each of the array of sensing antennae to produce a signal representing a characterizing parameter of the selected nuclei in the selected voxel elements, where this signal processing comprises the steps of:

(7a) providing predetermined first and second phase shifts for a first electromagnetic signal received at sensing antenna number $n = 1$, and forming first and second antenna output signals that are equal to the first electromagnetic signal with a phase shift equal to the first and second predetermined phase shifts, respectively;

(7b) providing predetermined third and fourth phase shifts for a second electromagnetic signal received at sensing antenna number $n = 2$, and forming third and fourth antenna output signals that are equal to the second electromagnetic signal with a phase shift equal to the third and fourth predetermined phase shifts, respectively;

(7c) adding the first and third antenna output signals to form and issue a first sum signal as a function of time that represents a first compensated electromagnetic signal received from the interrogation volume; and (7d) adding the second and fourth antenna output signals to form and issue a first sum signal as a function of time that represents a second compensated electromagnetic signal received from the interrogation volume.

2. The method of claim 1, wherein step (2) further comprises choosing said reorientation angle $\theta$ to be approximately 90°, and wherein step (4) comprises the steps of:

(4a) applying a fourth magnetic field $\underline{B}_3(y)$ that is a gradient field with amplitude changing with position in a predetermined second or y-direction that is perpendicular to said first direction, in a predetermined time interval given by $t_3 < t < t_3 + \Delta t_3$, where the amplitude of the fourth magnetic field $\underline{B}_3(y)$ is strictly monotonically increasing with change in the position coordinate y measured in the second direction;

(4b) applying a fifth magnetic field $\underline{B}_4(x)$ that is a gradient field with amplitude changing with position in a predetermined third or x-direction that is perpendicular to said first direction and to the second direction, in a predetermined time interval given by $t_4 < t < t_4 + \Delta t_4$, where the amplitude $B_4(x)$ of the fifth magnetic field is strictly monotonically increasing with change in the third position coordinate X measured in the third direction and $t_4$ is at least equal to $t_3 + \Delta t_3$;

(4c) applying a plurality of sixth radiofrequency magnetic fields $\underline{B}_5$ over a predetermined time interval given by $t_5 < < t_5 + \Delta t_5$ where $t_5 \geq t_4 + \Delta t_4$, where each of the fields $\underline{B}_5$ has a field direction that rotates with angular frequency $\omega$ in the rotation plane so that the component of magnetization parallel to the second direction or parallel to the third direction is inverted with respect to the corresponding magnetization component of the second magnetic field $\underline{B}_1$, and where the fields $\underline{B}_5$ are applied in a phased array to focus the sum of the fields $\underline{B}_5$ in the selected interrogation volume;

(4d) repeating steps (4a), (4b) and (4c) at a sequence of consecutive times for a corresponding sequence of fourth magnetic fields $\underline{B}_3(y)$ oriented in the first direction, where the amplitudes of the sequence of fields $\underline{B}_3(y)$, evaluated at any fixed value of the second position coordinate y, form a strictly monotonically increasing sequence in time, and where the fifth and sixth magnetic fields are maintained at their respective amplitudes and directions.

3. The method of claim 2, further comprising the step of repeating said steps (2) and (3) each time said steps (4a), (4b) and (4c) are repeated at said successive sequence of times.

4. The method of claim 2, further comprising the step of choosing an amplitude $B_2(z)$ of said third magnetic field $\underline{B}_2(z)$ to be of the form $B_2=G_z z$, where $G_z$ is approximately constant.

5. The method of claim 2, further comprising the step of choosing an amplitude $B_3(y)$ of said fourth magnetic field $\underline{B}_3(y)$ to be of the form $B_3=G_y y$, where $G_y$ is approximately constant.

6. The method of claim 2, further comprising the step of choosing an amplitude $B_4(x)$ of said fifth magnetic field $\underline{B}_4(x)$ to be of the form $B_4=G_x x$, where $G_x$ is approximately constant.

7. The method of claim 2, further comprising the step of choosing the magnitudes of said second magnetic fields $\underline{B}_1$ and said sixth magnetic fields $\underline{B}_5$ and said time intervals associated with these magnetic fields so that the magnetization vectors of said selected nuclei lie in said rotation plane after application of each of these magnetic fields.

8. The method of claim 7, further comprising the step of choosing said time interval lengths $\Delta t_1$ and $\Delta t_5$ to be approximately equal.

9. The method of claim 1, wherein step (2) further comprises choosing said reorientation angle $\theta$ to be approximately 90°, and wherein step (4) comprises the steps of:

(4a) applying a fourth magnetic field $\underline{B}_3(y)$ that is a gradient field with amplitude changing with position in a predetermined second or y-direction that is perpendicular to said first direction, in a predetermined time interval given by $t_3<t<t_3+\Delta t_3$, where the amplitude of the fourth magnetic field $\underline{B}_3(y)$ is strictly monotonically increasing with change in the second position coordinate y, and periodically reversing the polarization of this field; and (4b) applying a fifth magnetic field $\underline{B}_4(x)$ that is a gradient field with amplitude changing with position in a predetermined third or x-direction that is perpendicular to said first direction and to the second direction, in a predetermined time interval given by $t_4<t<t_4+\Delta t_4$, where the amplitude $B_4(x)$ of the fifth magnetic field is strictly monotonically increasing with change in the third position coordinate x and $t_4$ is at least equal to $t_3+\Delta t_3$.

10. The method of claim 9, further comprising the step of repeating said steps (2) and (3) each time said steps (4a), (4b) and (4c) are repeated at said successive sequence of times.

11. The method of claim 9, further comprising the step of choosing an amplitude $B_2(z)$ of said third magnetic field $\underline{B}_2(z)$ to be of the form $B_2=G_z z$, where $G_z$ is approximately constant.

12. The method of claim 9, further comprising the step of choosing an amplitude $B_3(y)$ of said fourth magnetic field $\underline{B}_3(y)$ to be of the form $B_3=G_y y$, where $G_y$ is approximately constant.

13. The method of claim 9, further comprising the step of choosing an amplitude $B_4(x)$ of said fifth magnetic field $\underline{B}_4(x)$ to be of the form $B_4=G_x x$, where $G_x$ is approximately constant.

14. The method of claim 1, wherein step (3) further comprises allowing the amplitude of said third magnetic field $\underline{B}_2(z)$ to change sign at a time within said time interval given by $t_2<t<t_2+\Delta t_2$ so that the amplitude of said third magnetic field, integrated over this time interval, is approximately zero, and wherein step (4) comprises the steps of:

(4a) applying a fourth magnetic field $\underline{B}_3(y)$ that is a gradient field with amplitude changing with position in a predetermined second or y-direction that is perpendicular to said first direction, in a predetermined time interval given by $t_3<t<t_3+\Delta t_3$, where the amplitude of the fourth magnetic field $\underline{B}_3(y)$ is strictly monotonically increasing with change in the second position coordinate y;

(4b) applying a fifth magnetic field $\underline{B}_4(x)$ that is a gradient field with amplitude changing with position in a predetermined third or x-direction that is perpendicular to said first direction and to the second direction, in a predetermined time interval given by $t_4<t<t_4+\Delta t_4$, where the amplitude of the fifth magnetic field $\underline{B}_4(x)$ is strictly monotonically increasing with change in a third position coordinate x, $t_4$ is at least equal to $t_3+\Delta t_3$, and the amplitude of the fifth magnetic field $\underline{B}_4(x)$, integrated over this time interval, is approximately zero;

(4c) repeating steps (4a) and (4b) at a sequence of consecutive times for a corresponding sequence of fourth magnetic fields $\underline{B}_3(y)$ lying in the second direction, where the amplitudes of the sequence of fields $\underline{B}_3(y)$, evaluated at any fixed value of the second position coordinate y, form a strictly monotonically increasing sequence in time, and where the amplitude and direction of the fifth magnetic field are maintained.

15. The method of claim 14, further comprising the step of repeating said steps (2) and (3) each time said steps (4a), (4b) and (4c) are repeated at said successive sequence of time intervals.

16. The method of claim 14, further comprising the step of choosing an amplitude $B_2(z)$ of said third magnetic field $\underline{B}_2(z)$ to be of the form $B_2=G_z z$, where $G_z$ is approximately constant.

17. The method of claim 14, further comprising the step of choosing an amplitude $B_3(y)$ of said fourth magnetic field $\underline{B}_3(y)$ to be of the form $B_3=G_y y$, where $G_y$ is approximately constant.

18. The method of claim 14, further comprising the step of choosing an amplitude $B_4(x)$ of said fifth magnetic field $\underline{B}_4(x)$ to be of the form $B_4=G_x x$, where $G_x$ is approximately constant.

19. The method of claim 14, further comprising the step of choosing said reorientation angle $\theta$ to be no more than 20°.

* * * * *

UNITED STATES PATENT AND TRADEMARK OFFICE
CERTIFICATE OF CORRECTION

PATENT NO. : 5,185,573

DATED : Feb. 9, 1993

INVENTOR(S) : John D. Larson, III

It is certified that error appears in the above-identified patent and that said Letters Patent is hereby corrected as shown below:

Column 1, line 21, change "(-Nature" to --(Nature--;

Column 1, line 35, change "$\underline{B}_0 = B_{0Hz}$" to --$\underline{B}_0 = B_0 \underline{i}_z$--;

Column 1, line 51, change "$\Omega$" to --$\underline{\Omega}$--;

Column 1, line 61, change "$\epsilon$" to --$\gamma$--;

Column 2, line 2, change "$\underline{B}1$" to --$\underline{B}_1$--

Column 2, line 7, change "is" to --in--;

Column 2, line 63, change "extend" to --extent--;

Column 3, line 43, change "$t_1 > t > t_1 + \Delta t_1$" to --$t_1 < t < t_1 + \Delta t_1$--;

Column 3, line 50, change "x, y, z" to --x', y', z'--;

Column 3, line 50, change "for" to --are--;

Column 4, line 6, change "tim" to --time--;

Column 4, line 54, change "with" to --within--;

Column 6, line 19, change "phase" to --phased--;

UNITED STATES PATENT AND TRADEMARK OFFICE
CERTIFICATE OF CORRECTION

PATENT NO. : 5,185,573

DATED : Feb. 9, 1993

INVENTOR(S) : John D. Larson, III

It is certified that error appears in the above-identified patent and that said Letters Patent is hereby corrected as shown below:

Column 7, line 25, change "to" to --top--;

Column 7, line 62, change "$\underline{B}_0 = B_{0i_z}$" to --$\underline{B}_0 = B_0 \underline{i}_z$--;

Column 9, line 49, change "services" to --serves--;

Column 11, line 64, change "echos" to --echoes--;

Column 12, line 61, change "physicological" to --physiological--;

Column 13, line 24, change "antenna" to --antennae--;

Column 13, line 50, change "one applicator" to --the applicator--;

Column 15, line 35, change "distanced" to --distance--;

Column 15, line 45, change "$\psi_n = 2\pi R_n \lambda + \phi_n$" to --$\psi_n = 2\pi R_n / \lambda + \phi_n$--;

Column 15, line 59, change "relation" to --relations--;

Column 16, line 7, change "antenna" to --antennae--;

Column 16, line 39, change "along" to --alone--;

Column 17, line 13, change "through the controllable" to --through controllable--;

UNITED STATES PATENT AND TRADEMARK OFFICE
CERTIFICATE OF CORRECTION

PATENT NO. : 5,185,573

DATED : Feb. 9, 1993

INVENTOR(S) : John D. Larson, III

It is certified that error appears in the above-identified patent and that said Letters Patent is hereby corrected as shown below:

Column 17, line 53, change "magnetic radiation" to --magnetic field radiation--;

Column 18, line 8, change "in" to --on--;

Column 18, line 13, change "responsive" to --response--;

Column 18, line 34, change "$\phi=100_{n,1}$" to --$\phi=\phi_{n,1}$--;

Column 18, line 52, change "J<1" to --J-1--;

Column 19, line 5, change "deliver" to --delivers--;

Column 19, line 8, change "$\phi_{n,1}$" to --$\phi'_{n,1}$--;

Column 19, line 13, change "$\phi=\phi_{n,j}$" to --$\phi'=\phi'_{n,j}$--;

Column 19, line 24, change "ration" to --ratio--;

UNITED STATES PATENT AND TRADEMARK OFFICE
CERTIFICATE OF CORRECTION

PATENT NO. : 5,185,573

DATED : Feb. 9, 1993

INVENTOR(S) : John D. Larson, III

It is certified that error appears in the above-identified patent and that said Letters Patent is hereby corrected as shown below:

Column 19, line 42, change "direction, application" to --direction, after application--;

Column 20, line 34, change "first" to --second--;

Column 20, line 63, change "$t_5<<t_5+\Delta t_5$" to --$t_5<t<t_5+\Delta t_5$--;

Signed and Sealed this

Fifteenth Day of November, 1994

Attest:

BRUCE LEHMAN

*Attesting Officer*     *Commissioner of Patents and Trademarks*